US012685156B2

(12) United States Patent
Kim et al.

(10) Patent No.: US 12,685,156 B2
(45) Date of Patent: Jul. 14, 2026

(54) ELECTRONIC DEVICES AND METHODS OF MANUFACTURING ELECTRONIC DEVICES

(71) Applicant: Amkor Technology Singapore Holding Pte. Ltd., Singapore (SG)

(72) Inventors: Joon Dong Kim, Incheon (KR); Gi Tae Lim, Seoul (KR); Gi Jeong Kim, Gyeonggi-do (KR); Min Hwa Chang, Incheon (KR); Gyu Wan Han, Incheon (KR); Hwi Won Yun, Gyeonggi-do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 360 days.

(21) Appl. No.: 18/465,844

(22) Filed: Sep. 12, 2023

(65) Prior Publication Data

US 2025/0087546 A1      Mar. 13, 2025

(51) Int. Cl.
| | |
|---|---|
| *H10W 40/22* | (2026.01) |
| *H10W 70/02* | (2026.01) |
| *H10W 72/00* | (2026.01) |
| *H10W 74/01* | (2026.01) |
| *H10W 74/10* | (2026.01) |
| *H10W 72/20* | (2026.01) |
| *H10W 72/50* | (2026.01) |
| *H10W 74/15* | (2026.01) |
| *H10W 90/00* | (2026.01) |

(52) U.S. Cl.
CPC ........... *H10W 40/22* (2026.01); *H10W 70/02* (2026.01); *H10W 72/884* (2026.01); *H10W 74/014* (2026.01); *H10W 74/016* (2026.01);

*H10W 74/117* (2026.01); *H10W 72/07554* (2026.01); *H10W 72/252* (2026.01); *H10W 72/552* (2026.01); *H10W 72/5522* (2026.01); *H10W 72/5524* (2026.01); *H10W 72/5525* (2026.01); *H10W 72/555* (2026.01); *H10W 74/15* (2026.01); *H10W 90/724* (2026.01); *H10W 90/734* (2026.01); *H10W 90/754* (2026.01)

(58) Field of Classification Search
None
See application file for complete search history.

(56) References Cited

U.S. PATENT DOCUMENTS

| | | | |
|---|---|---|---|
| 6,469,380 | B2 | 10/2002 | Sorimachi et al. |
| 6,507,116 | B1 | 1/2003 | Caletka et al. |
| 6,534,859 | B1 | 3/2003 | Shim et al. |
| 7,436,060 | B2 | 10/2008 | Patel et al. |
| 8,049,313 | B2 * | 11/2011 | Foong ................. H10W 74/127 |
| | | | 257/706 |

(Continued)

FOREIGN PATENT DOCUMENTS

| | | |
|---|---|---|
| KR | 10-2006-0036433 A | 4/2006 |
| KR | 10-2011-0028745 A | 3/2011 |

*Primary Examiner* — Cory W Eskridge

(57) ABSTRACT

In one example, an electronic device includes a substrate, an electronic component disposed over the substrate, and an encapsulant disposed over the substrate and the electronic component. A molded heat spreader can be disposed over the encapsulant and can comprise a heat spreader and a mold compound disposed around a lateral side of the heat spreader. A lateral side of the mold compound is coplanar with a lateral side of the encapsulant. Other examples and related methods are also disclosed herein.

14 Claims, 15 Drawing Sheets

(56) References Cited

U.S. PATENT DOCUMENTS

| | | | | |
|---|---|---|---|---|
| 9,711,485 | B1 * | 7/2017 | Berry | H10W 90/701 |
| 11,289,401 | B2 | 3/2022 | Huang | |
| 2006/0231944 | A1 * | 10/2006 | Huang | H10W 74/117 |
| | | | | 257/E23.092 |
| 2010/0044845 | A1 * | 2/2010 | Funaya | H05K 1/185 |
| | | | | 257/E23.141 |
| 2014/0239479 | A1 * | 8/2014 | Start | H10W 40/70 |
| | | | | 257/706 |
| 2015/0340303 | A1 * | 11/2015 | Oh | H10W 40/10 |
| | | | | 438/109 |
| 2020/0266121 | A1 | 8/2020 | Fuergut et al. | |
| 2020/0343236 | A1 * | 10/2020 | Bhagavat | H10W 70/614 |

* cited by examiner

ELECTRONIC DEVICES AND METHODS OF MANUFACTURING ELECTRONIC DEVICES

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
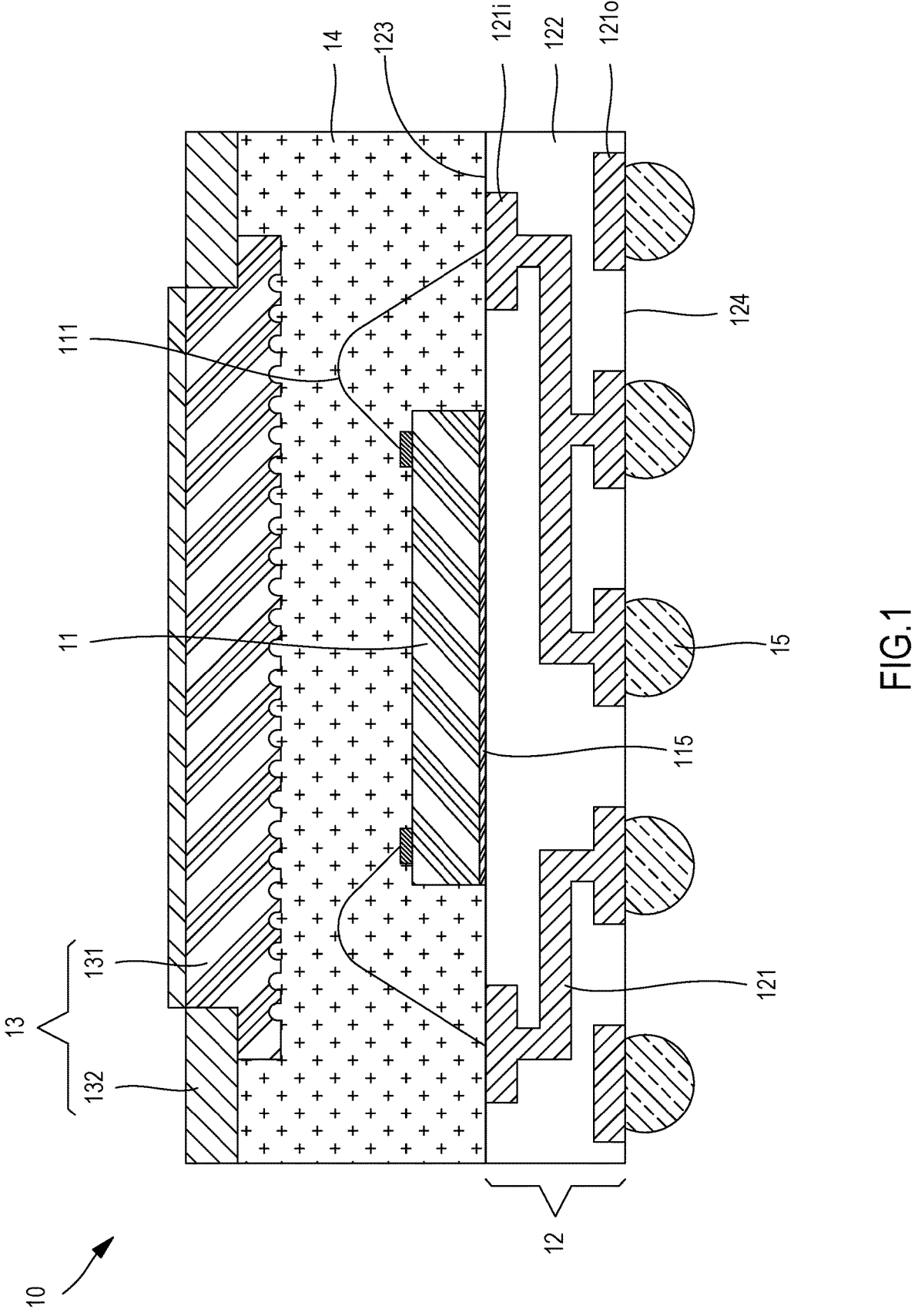
FIG. 1 shows a cross-sectional view of an example electronic device.

The following discussion provides various examples of electronic devices and methods of manufacturing electronic devices. Such examples are non-limiting, and the scope of the appended claims should not be limited to the particular examples disclosed. For example, the steps recited in any of the method or process descriptions may be executed in any order and are not necessarily limited to the order presented. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and "including," are "open ended" terms and specify the presence of stated features, but do not preclude the presence or addition of one or more other features.

The terms "first," "second," etc. may be used herein to describe various elements, and the described elements should not be limited by these terms. These terms are only used to distinguish one element from another. For example, a first element discussed in this disclosure could be termed a second element without departing from the teachings of the present disclosure.

Unless specified otherwise, the term "coupled" may be used to describe two elements directly contacting each other or describe two elements indirectly coupled by one or more other elements. For example, if element A is coupled to element B, then element A can be directly contacting element B or indirectly coupled to element B by an intervening element C. Similarly, the terms "over" or "on" may be used to describe two elements directly contacting each other or describe two elements indirectly coupled by one or more other elements. As used herein, the term "coupled" can refer to an electrical coupling or a mechanical coupling.

DESCRIPTION

An example electronic device can include a substrate, an electronic component disposed over the substrate, and an encapsulant disposed over the substrate and the electronic component. A molded heat spreader can be disposed over the encapsulant and can comprise a heat spreader and a mold compound disposed around a lateral side of the heat spreader. A lateral side of the mold compound is coplanar with a lateral side of the encapsulant.

In various examples, the heat spreader can include a first side subjected to a surface treatment to increase a roughness. The first side is oriented towards the encapsulant. A plating layer is disposed over a second side of the heat spreader opposite the first side. A bond pad of the electronic component is oriented away from the substrate. A component interconnect couples the bond pad to the substrate. The mold compound is disposed over a portion of the heat spreader, around the lateral side of the heat spreader, and over the encapsulant. A lower side of the heat spreader extends below a lower side of the mold compound. The substrate comprises a redistribution layer (RDL) substrate. The lateral side of the encapsulant comprises a step, with a first portion of the lateral side of the encapsulant being coplanar with the lateral side of the mold compound. A second portion of the lateral side of the encapsulant protrudes from the first portion. The lateral side of the heat spreader can include a step.

Another example electronic device includes a substrate, an electronic component disposed over the substrate, and an interposer disposed over the substrate and defining a cavity. A heat spreader can be disposed over the electronic component and in the cavity defined by the interposer. An encapsulant is disposed between the heat spreader and the electronic component and disposed between the heat spreader and the interposer.

In various examples, a bond pad of the electronic component is oriented away from the substrate. A component interconnect couples the bond pad to the substrate. The substrate comprises a redistribution layer (RDL) substrate. An internal interconnect couples the substrate to the interposer. A component interconnect is disposed between the electronic component and the substrate. The component interconnect couples the electronic component to the substrate.

An example method includes the steps of providing a heat spreader, providing a mold compound around a lateral side of the heat spreader, and removing a portion of the heat spreader to leave a cavity defined by the lateral side of the heat spreader and an upper side of the mold compound. An upper side of the heat spreader is treated to increase a roughness. An electronic component and a substrate are provided over the upper side of the heat spreader. An encapsulant is provided between the heat spreader and the substrate.

In various examples, a plating layer is provided over a lower side of the heat spreader opposite the upper side of the heat spreader. A portion of the heat spreader is removed to define a cavity around the lateral side of the heat spreader. The mold compound is provided in the cavity. A portion of the mold compound is removed to leave a lower side of the heat spreader is coplanar with a lower side of the mold compound. A strip of heat spreaders can be coupled together by tie bars, and the tie bars can be formed integrally with the heat spreaders. The method can include cutting through a tie bar and the mold compound to singulate the electronic device. The tie bar and the mold compound can define a singulation line between adjacent heat spreaders in the strip of heat spreaders.

Other examples are included in the present disclosure. Such examples may be found in the figures, in the claims, or in the description of the present disclosure.

Various examples include molded heat spreaders or heat spreader strips. Heat spreader strips can include a row, column, or array of heat spreaders connected to one another by mold compound or tie bars. Molded heat spreader strips can be aligned over electronic components, packaged, and singulated to make electronic devices.

In some examples, the mold compound or tie bars between heat spreaders can define a singulation line. The use of mold compound or tie bars between adjacent heat spreaders can stiffen the molded heat spreader strip and couple adjacent heat spreaders to one another during various processing steps. The use of mold compound or tie bars can also reduce the amount of metal disposed in the singulation lines between electronic devices. Electronic devices can be cut, sawn, or otherwise separated along the singulation line comprising mold compound or tie bars to reduce burring or other imperfections that can occur during singulation through larger quantities of metal and other hard materials. The tie bars can also reduce movement or shifting of the heat spreaders during application of the mold compound.

Referring now to FIG. 1, a cross-sectional view of an example electronic device 10 is shown. In the example shown in FIG. 1, electronic device 10 can comprise electronic component 11, substrate 12, molded heat spreader 13, device encapsulant 14, and external interconnects 15.

Substrate 12 can comprise conductive structure 121 and dielectric structure 122. Conductive structure 121 can comprise substrate inner terminals 121*i* and substrate outer terminals 121*o*. Inner terminals 121*i* can be located at a first (or inner) side 123 of substrate 12. Outer terminals 121*o* can be located at a second (or outer) side 124 of substrate 12 that is opposite inner side 123. Molded heat spreader 13 can comprise heat spreader 131 and mold compound 132. In some examples, electronic component 11 can be coupled to substrate 12 via a die attach material 115.

Figures 2A, 2B:
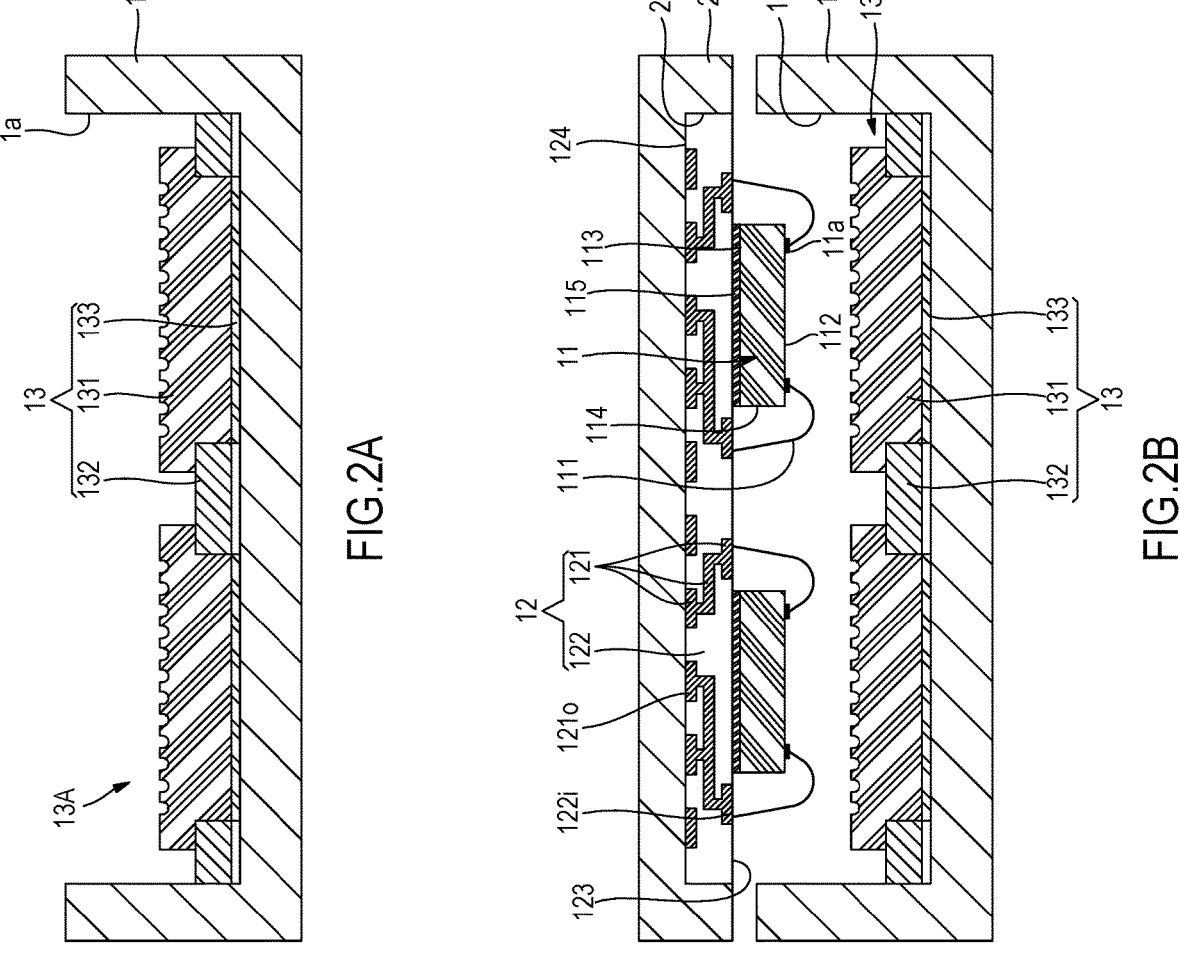
FIGS. 2A to 2D show an example method for manufacturing an electronic device.

FIGS. 2A to 2D show an example method for manufacturing an electronic device 10. FIG. 2A shows a cross section view of electronic device 10 at an early stage of manufacture. In the example shown in FIG. 2A, molded heat spreader strip 13A can be seated on bottom mold chase 1. Molded heat spreader strip 13A can also be referred to herein as a molded substrate strip. Bottom mold chase 1 can define cavity 1*a* that receives molded heat spreader strip 13A. Molded heat spreader strip 13A can be made using techniques described in greater detail below.

In accordance with various examples, molded heat spreader strip 13A can include molded heat spreaders 13. Molded heat spreader 13 can comprise heat spreader 131 and mold compound 132. Molded heat spreader strip 13A comprises heat spreaders 131 arranged in a row, column, grid, or array. Mold compound 132 can couple adjacent heat spreaders 131 to one another. Mold compound 132 can define a singulation line between adjacent heat spreaders 131.

In various examples, an upper side of heat spreader 131 can be treated to roughen an exposed mating surface of the heat spreader 131. In some examples, a plating layer 133 can be disposed on a lower side of heat spreader 131 opposite the upper side.

FIG. 2B shows a cross section view of electronic device 10 at a later stage of manufacture. In the example shown in FIG. 2B, top mold chase 2, where substrate 12 and electronic component 11 are seated, can be aligned on the upper side of bottom mold chase 1, where molded heat spreader strip 13A is seated. Electronic components 11 can be aligned over heat spreaders 131 in response to upper mold chase 2 being aligned over bottom mold chase 1.

In accordance with various examples, electronic components 11 can be coupled to substrate 12 prior to locating substrate 12 and electronic components 11 within upper mold chase 2. For example, electronic components 11 can be provided on inner side 123 of substrate 12. In some examples, electronic components 11 can be coupled to inner side 123 via an adhesive or other die attach material 115.

In some examples, substrate 12 can comprise or be referred to as a laminate substrate, a redistribution layer (RDL) substrate, a buildup substrate, a coreless substrate, a rigid substrate, a glass substrate, a semiconductor substrate, a printed circuit board, a multi-layer substrate, a molded lead frame, or a ceramic substrate. Substrate 12 can comprise conductive structure 121 and dielectric structure 122. In some examples, substrate 12 can have a thickness of about 0.2 mm to about 4 mm.

In some examples, conductive structure 121 can comprise or be referred to as one or more conductors, conductive materials, conductive paths, conductive layers, RDLs, wiring layers, traces, vias, pads, or under bump metallization (UBM). Conductive structure 121 can comprise one or more conductive layers. In some examples, one or more of the conductive layers can be interleaved with dielectric layers of dielectric structure 122. Conductive structure 121 can define conductive paths through dielectric structure 122 with elements such as traces, pads, vias, and wiring patterns. In some examples, conductive structure 121 can comprise copper, aluminum, palladium, titanium, tungsten, titanium/tungsten, nickel, gold, or silver. In some examples, conductive structure 121 can be provided by sputtering, electroless plating, electrolytic plating, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), or other processes as known to one of ordinary skill in the art. In some examples, portions of conductive structure 121 can be exposed from inner side 123 of substrate 12 and from outer side 124 of substrate 12. Conductive structure 121 can transmit signals, currents, or voltages within substrate 12. In some examples, the thickness of conductive structure 121 can range from about 3 μm to about 100 μm. The thickness of conductive structure 121 can refer to individual layers of conductive structure 121.

Conductive structure 121 can include substrate inner terminals 121*i* and substrate outer terminals 121*o*. Substrate inner terminals 121*i* can be exposed from inner side 123 of substrate 12, and substrate outer terminals 121*o* can be exposed from outer side 124 of substrate 12. In various examples, substrate inner terminals 121*i* and substrate outer terminals 121*o* can be respectively provided on the inner side 123 of substrate 12 and the outer side 124 of substrate 12 in a matrix form having rows or columns. In some examples, substrate inner terminals 121*i* and substrate outer terminals 121*o* can comprise or be referred to as a conductor, a conductive material, a substrate land, a conductive land, a substrate pad, a wiring pad, a connection pad, a micro pad, or under-bump-metallurgy (UBM). In some examples, the thicknesses of substrate inner terminals 121*i* and substrate outer terminals 121*o* can each range from approximately 3 μm to approximately 100 μm. Conductive structure 121 can be coupled to electronic components 11 and external interconnects 15 (FIG. 1). For example, electronic components 11 can be coupled to substrate inner terminals 121*i* and external interconnects 15 (FIG. 1) can be coupled to substrate outer terminals 121*o*.

In some examples, dielectric structure 122 can comprise or be referred to as one or more dielectrics, dielectric materials, dielectric layers, passivation layers, insulating layers, or protective layers. In some examples, dielectric structure 122 can have a structure where one or more dielectric layers are stacked. In some examples, dielectric structure 122 can comprise a polymer, polyimide (PI), benzocyclobutene (BCB), polybenzoxazole (PBO), bismaleimide triazine (BT), a molding material, phenolic resin, epoxy, silicone, or acrylate polymer. Dielectric structure 122 can be in contact with conductive structure 121. Dielectric structure 122 can expose portions of conductive structure 121. In some examples, dielectric structure 122 can maintain the external shape of substrate 12 and can structurally support conductive structure 121 and electronic components 11. In some examples, dielectric structure 122 can be provided by spin coating, spray coating, printing, oxidation, PVD, CVD, MOCVD, ALD, LPCVD, PECVD, or other processes as known to one of ordinary skill in the art. The upper and lower sides of dielectric structure 122 can be part of inner side 123 of substrate 12 and outer side 124 of substrate 12, respectively. In some examples, the thicknesses of individual layers of dielectric structure 122 can range from about 3 μm to about 100 μm. The combined thickness of all layers of dielectric structure 122 can define the thickness of substrate 12.

In some examples, substrate 12 can be an RDL substrate. RDL substrates can comprise one or more conductive redistribution layers and one or more dielectric layers and (a) can be formed layer by layer over an electronic device to where the RDL substrate is to be coupled, or (b) can be formed layer by layer over a carrier and can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask.

In some examples, dielectric layers of the RDL substrate can be patterned with a photo-patterning process and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer.

Although the photo-definable dielectric materials described above can be organic materials, in some examples, the dielectric materials of the RDL substrates can comprise one or more inorganic dielectric layers. Some examples of inorganic dielectric layer(s) can comprise silicon nitride (Si3N4), silicon oxide (SiO2), and/or silicon oxynitride (SiON). The inorganic dielectric layer(s) can be formed by growing the inorganic dielectric layers using an oxidation or nitridization process instead using photo-defined organic dielectric materials. Such inorganic dielectric layers can be filler-free, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Substrates, as disclosure herein, can comprise RDL substrates.

In various examples, substrate 12 can be a pre-formed substrate. A pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers and can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF).

In various examples, the pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate and omits the permanent core structure, and the dielectric and conductive layers can be formed on a sacrificial carrier and is removed after formation of the dielectric and conductive layers and before attachment to the electronic device. The pre-formed substrate can be referred to as a printed circuit board (PCB) or a laminate substrate. Such pre-formed substrate can be formed through a semi-additive or modi-fied-semi-additive process. Substrates, as disclosed herein, can comprise pre-formed substrates.

According to various examples, electronic component 11 can be provided on inner side 123 of substrate 12. Electronic component 11 can comprise a first (or upper) side 112, a second side 113 opposite to first side 112, and a lateral side 114 connecting first side 112 to second side 113. In some examples, first side 112 of electronic component 11 can comprise or be referred to as an active or front side where circuit elements can be formed, and second side 113 of electronic component 11 can comprise or be referred to as an inactive or back side. In some examples, electronic component 11 can comprise contact pads 11a proximate to first side 112, which can be coupled to the circuit elements within or on electronic component 11. In the present example, second side 113 of electronic component 11 is proximate to inner side 123 of substrate 12 and second side 113 of electronic component 11 is distal, or oriented away from, inner side 123 of substrate 12. In some examples, electronic component 11 can comprise or be referred to as a die, a chip, or a package.

Electronic component 11 can be coupled to inner side 123 of substrate 12 via an adhesive or other die attach material. For example, adhesive can be applied to inner side 123 of substrate 12 or second side 113 of electronic component 11. With the adhesive in place, pick-and-place equipment can pick up electronic components 11 and place electronic components 11 on inner side 123 of substrate 12, such that the adhesive is located between second side 113 of elec-tronic component 11 and inner side 123 of substrate 12 and couples electronic component 11 to substrate 12.

Electronic components 11 can comprise contact pads 11a provided on first side 112. Contact pads 11a can be input/output terminals of electronic component 11. In some examples, contact pads 11a can comprise or be referred to as die pads or bond pads. In some examples, contact pads 11a comprise a an electrically conductive material such as, for example, aluminum, copper, an aluminum alloy, or a copper alloy.

In accordance with various examples, electronic compo-nents 11 can comprise component interconnects 111 coupled between contact pads 11a and inner terminals 121i of substrate 12. In some examples, component interconnects 111 can comprise or be referred to as conductive wires or bond wires. In some examples, component interconnects 111 can comprise gold, copper, aluminum, copper coated with palladium, or any other suitable electrically conductive material. The diameter of component interconnects 111 can range from approximately 15 μm to approximately 30 μm.

While electronic components 11 are illustrated as being coupled to substrate 12 via wire bonds, it is further contem-plated and understood that in various examples one or more of the electronic components 11 can be coupled to substrate 12 as flip chips. For example, first side 112 of electronic component 11 can be oriented toward inner side 123 of substrate 12, and contact pads 11a can be coupled to inner terminals 121i via solder bumps, copper posts, solder capped copper posts, or any other suitable interconnect structure that can be positioned vertically between contact pads 11a and inner terminals 121i.

In various examples, the overall thickness of electronic component 11 can range from approximately 50 μm to approximately 350 μm. In some examples, the area of electronic component 11 can be smaller than the area of the inner side of heat spreader 131. In some examples, the area of the electronic component 11 can range from approxi-mately 4 mm×4 mm to approximately 25 mm×25 mm.

Substrate 12 having electronic components 11 coupled thereto can be located in top mold chase 2 such that outer side 124 of substrate 12 is coupled to or in contact with top mold chase 2, and inner side 123 of substrate 12 (e.g., the side to which electronic component 11 is coupled) is ori-ented toward bottom mold chase 1 and molded substrate strip 13A. Top mold chase 2 can comprise a flat mold ceiling and a mold sidewall extending downward from an edge of the ceiling. Top mold chase 2 can have cavity 2a inside defined by the mold ceiling and the mold sidewall. Top mold chase 2 can be picked up by pick-and-place equipment and aligned with bottom mold chase 1 so heat spreader 131 is positioned below electronic component 11.

Figures 2C, 2D:
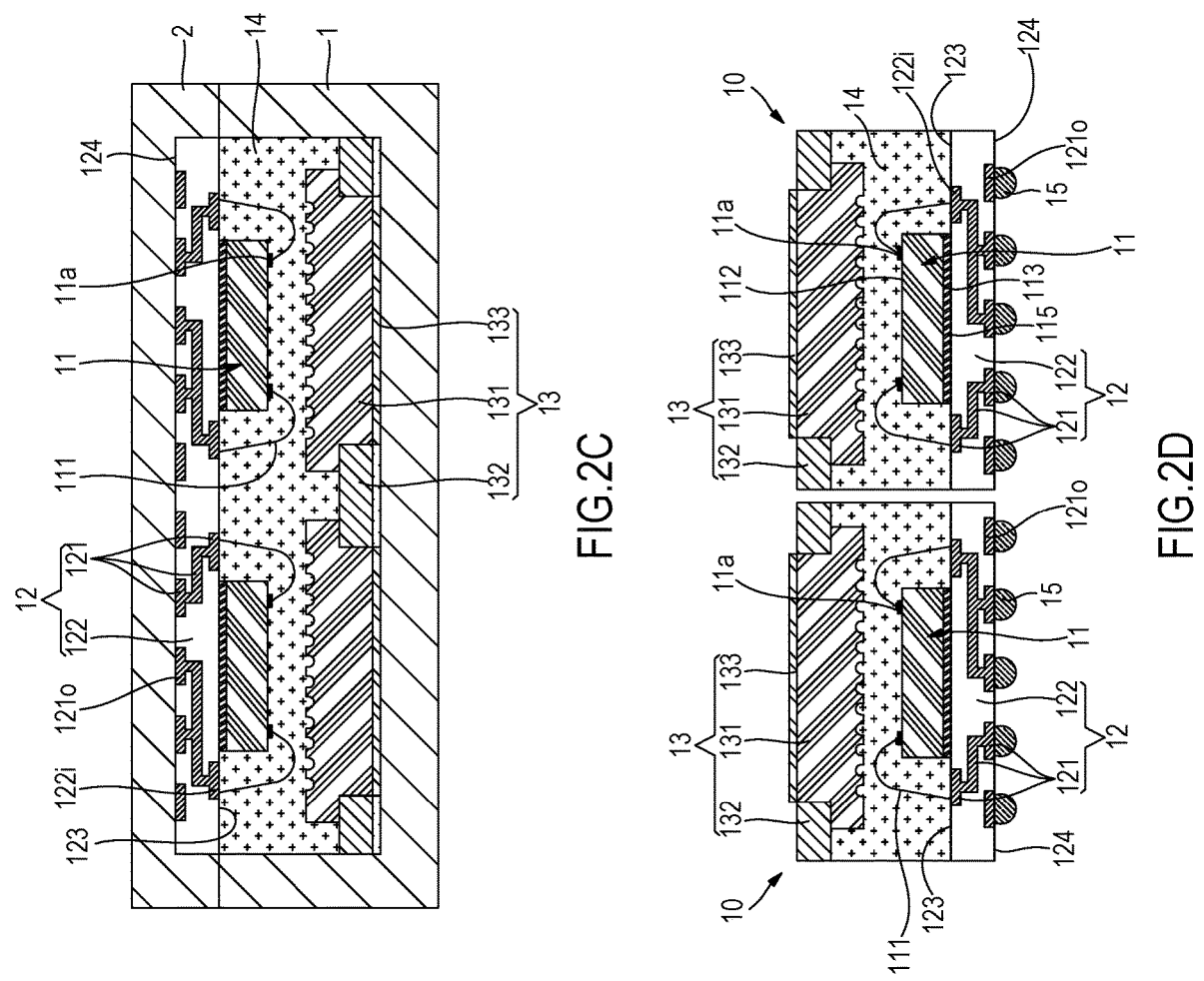

FIG. 2C shows a cross section view of electronic device 10 at a later stage of manufacture. In the example shown in FIG. 2C, device encapsulant 14 can be provided between substrate 12 and molded heat spreader strip 13A and between electronic component 11 and molded heat spreader strip 13A. Device encapsulant 14 can be provided within and can fill the cavity defined by bottom mold chase 1 and top mold chase 2.

In some examples, device encapsulant 14 can be provided in powder form and can fill cavity 1a of bottom mold chase 1. Heat can be then provided to melt the powder of device encapsulant 14 with the sidewall of top mold chase 2 and the sidewall of bottom mold chase 1 in contact and tightly pressed towards one another. The melted device encapsulant 14 can fill the volume between substrate 12 and molded heat spreader strip 13A and between electronic component 11 and molded heat spreader strip 13A. In some examples, device encapsulant 14 can be provided by transfer molding, which can avoid or reduce occurrence of deformation or damage to component interconnects 111.

In various examples, device encapsulant 14 can comprise or be referred to as a body or a molding. For example, device encapsulant 14 can comprise an epoxy mold compound (EMC), filler-reinforced polymer, B-stage pressed film or gel. In some examples, device encapsulant 14 can contact first side 112 and lateral sides 114 of electronic component 11, component interconnects 111, inner side 123 of substrate 12, the inner side of heat spreader 131 (i.e. the side of heat spreader 131 that is oriented toward electronic component 11), a portion of the lateral side of heat spreader 131, or the inner side of mold compound 132 (i.e. the side of mold compound 132 that is oriented toward electronic component 11). Surface treatment can increase the roughness of the inner side of heat spreader 131. The roughened surface can improve bonding of device encapsulant 14 to heat spreader 131. After device encapsulant 14 is provided, top mold chase 2 and bottom mold chase 1 can be separated. The thickness of device encapsulant 14 can range from approximately 100 μm to approximately 1000 μm. Device encapsulant 14 can protect electronic component 11 from external elements and other environmental factors. While FIGS. 2A-2C illustrate molded heat spreader strip 13A in bottom mold chase 1 and substrate 12 in top mold chase 2, it is contemplated and understood that in some examples, molded substrate strip 13A can be located in top mold chase 2 and substrate 12 in bottom mold chase 1.

FIG. 2D shows a cross section view of electronic device 10 at a later stage of manufacture. In the example shown in FIG. 2D, encapsulated electronic components 11 and molded substrate strip 13A can be removed from mold chases 1 and 2, and external interconnects 15 can be provided on outer side 124 of substrate 12. External interconnects 15 can be coupled to substrate outer terminals 121o. In some examples, external interconnects 15 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. For example, external interconnects 15 can be provided through a reflow process after forming a conductive material including solder on substrate outer terminals 121o through a ball drop process. External interconnects 15 can comprise or be referred to as conductive balls such as solder balls, conductive pillars such as Kappa pillars, conductive posts having solder caps provided on Kappa pillars, bumps, or pads. In some examples, the sizes of external interconnects 15 can range from approximately 25 μm to approximately 500 μm. In some examples, external interconnects 15 can be referred to as external input/output terminals of electronic device 10. In some examples, electronic device 10 can be a land grid array (LGA) where substrate outer terminals 121o serve as external input/output terminals without external interconnects 15.

In various examples, after external interconnects 15 are provided, substrate 12, mold compound 132 of molded heat spreader 13, and device encapsulant 14 can be sawed to separate strip-type electronic devices 10 into individual electronic devices 10. The sawing process of separating each of electronic devices 10 can be referred to as a singulation process. For example, substrate 12, mold compound 132, and device encapsulant 14 can be separated into individual electronic devices 10 using a diamond wheel, a laser beam, or an etching process. In some examples, during singulation, the sawing is performed through dielectric structure 122 of substrate 12, device encapsulant 14, mold compound 132 of molded heat spreader 13, and tie bars of molded heat spreader 13, as discussed in further detail below. In some examples, the tie bars of molded heat spreader 13 can be the only conductive (e.g., metal) structure through which sawing takes place. In some examples, the sawing may also expose portions of conductive structure 121 at the lateral sides of substrate 12. Reducing the metal structures, and in particular, the volume of heat spreader material, that are sawed during singulation tends to prevent or reduce the generation of conductive foreign substances and can reduce wear of sawing equipment. Molding heat spreaders 131 allows the heat spreaders 131 to be handled as a panel or strip during placement within bottom mold chase 1. In some examples, the singulation process can remove tie bars of molded heat spreader 13.

In various examples, electronic device 10 can comprise electronic component 11, substrate 12, molded heat spreader 13, device encapsulant 14, and external interconnects 15. Heat spreader 131 of molded heat spreader 13 can be disposed above electronic component 11. Heat spreader 131 can dissipate heat generated in electronic component 11 outward from electronic device 10.

Figures 3A, 3B, 3C:
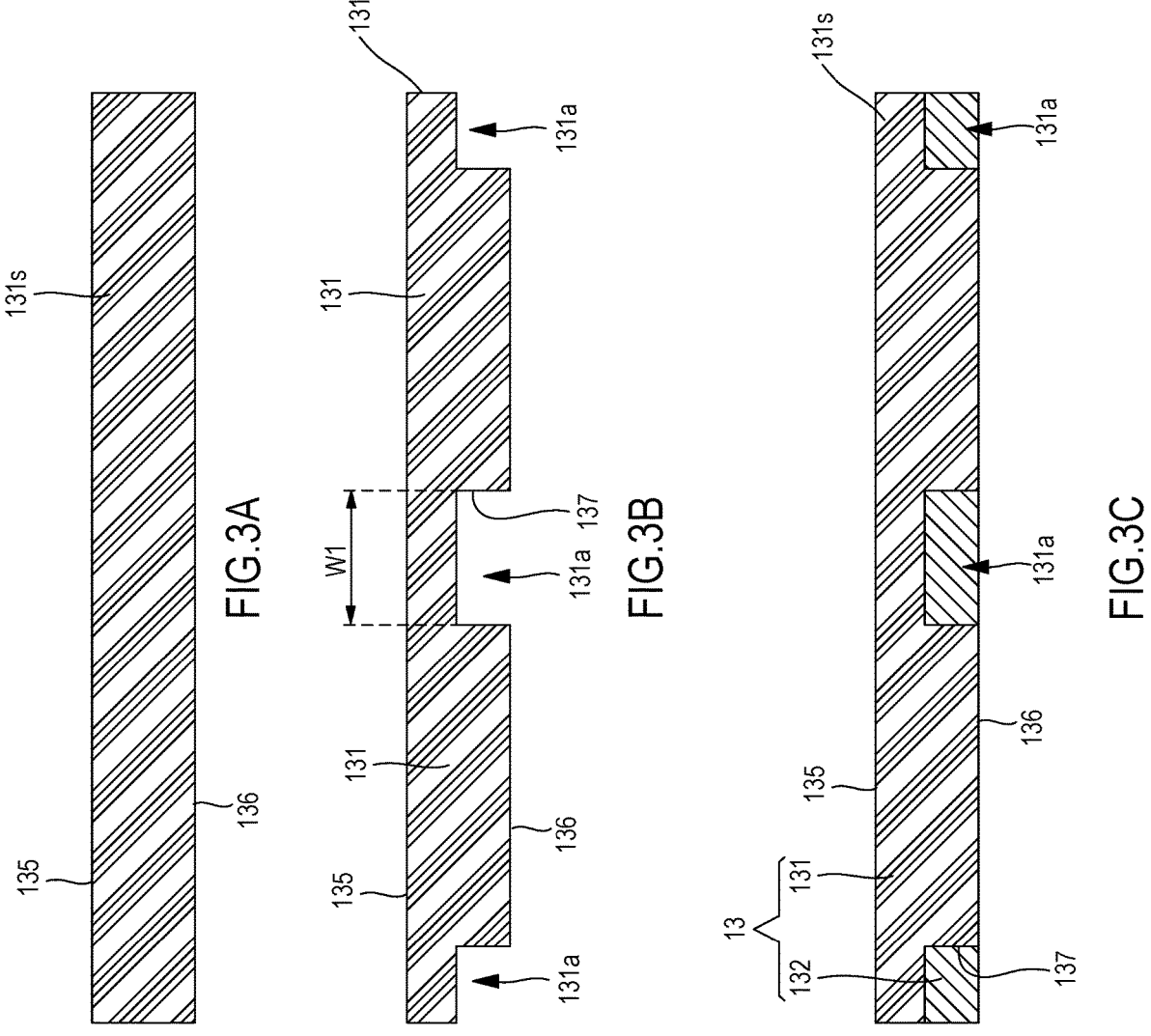
FIGS. 3A to 3F show an example method for manufacturing a molded heat spreader strip.

FIGS. 3A to 3F show cross-sectional views of an example method for manufacturing molded heat spreader strip 13A in electronic device 10. FIG. 3A shows a cross section view of molded heat spreader strip 13A at an early stage of manufacture. In the example shown in FIG. 3A, a heat spreader substrate 131s can be provided. In some examples, heat spreader substrate 131s is substantially a planer plate having a first (or upper) side 135 and a second (or lower) side 136, which are both substantially flat/planar. Heat spreader substrate 131s can be in the form of a strip or panel. In some examples, heat spreader substrate 131s can be made of a material, with thermal conduction, such as, for example, a copper alloy (at least one of Ni, Si, P, and Ti being included in Cu), an iron-nickel alloy, or a Cu/SUS/Cu clad metal. The thickness of heat spreader substrate, 131s can range from approximately 100 μm (micrometers) to approximately 381 μm.

FIG. 3B shows a cross section view of molded heat spreader strip 13A at a later stage of manufacture. In the example shown in FIG. 3B, a portion of heat spreader substrate 131s can be removed from second side 136 to leave cavity 131a defined by a lateral side (or sidewall) 137 of heat spreader 131. Cavity 131a can have a rectangular or square ring shape on a plane and can surround a protruding portion of each heat spreader 131 (the protruding portion can include lateral side 137 and second side 136). Cavity 131a can extend partially through each heat spreader 131, such that a portion of heat spreader 131 remains between the floor of cavity 131a and first side 135. In some examples, cavity 131a can be formed by etching. For example, a mask pattern can be provided on second side 136 of heat spreader substrate 131s, and cavity 131a can be provided by etching through portions of second side 136 that are exposed from the mask pattern to remove a volume of heat spreader substrate 131s from the exposed portions of second side 136. For example, photoresist can be used as the mask pattern. In some examples, the depth of cavity 131a can be about half the thickness of heat spreader substrate 131s. In some examples, the depth of cavity 131a can be greater than half the thickness of heat spreader substrate 131s. The depth of cavity 131a can range from approximately 50 μm to approximately 127 μm. The width W1 of cavity 131a can range from approximately 425 μm to approximately 500 μm. As used herein with reference to lengths, the term approximately can mean +/−5%, +/−10%, +/−15%, +/−20%, or +/−25%.

FIG. 3C shows a cross section view of molded heat spreader strip 13A at a later stage of manufacture. In the example shown in FIG. 3C, mold compound 132 can be provided in cavity 131a of heat spreader 131. In some examples, mold compound 132 can fill cavity 131a. Mold compound 132 can be disposed around lateral side 137 of heat spreader 131. In some examples, mold compound 132 can cover second side 136 of heat spreader 131. The portions of mold compound 132 covering second side 136 can be removed by grinding. In some examples, second side 136 can also be ground during the grinding of mold compound 132 (in this regard, second side 136 in FIG. 3C can refer to second side after griding). In accordance with various examples, the lower (or first) side of mold compound 132 and second side 136 of heat spreader 131 can be coplanar.

In some examples, mold compound 132 can comprise or be referred to as a dielectric material, a dielectric layer, an insulating layer, a protective layer, or an encapsulant. In some instances, mold compound 132 can comprise or be referred to as a pre-mold or pre-forming mold. In some examples, mold compound 132 can be made of epoxy mold compound (EMC), resin, filler-reinforced polymer, B-stage pressed film, or gel. In some examples, mold compound 132 can be provided in any of a variety of ways. For example, the mold compound 132 can be provided by compression molding, transfer molding, liquid encapsulant molding, vacuum lamination, paste printing, screen printing, or film assist molding.

When observed in plan view, mold compound 132 can have a rectangular or square ring shape about the perimeter of second side 136. The thickness of mold compound 132 can be less than the thickness of heat spreader 131. In some examples, the thickness of mold compound 132 can be equal to or greater than half the thickness of heat spreader 131.

Figures 3D, 3E, 3F:
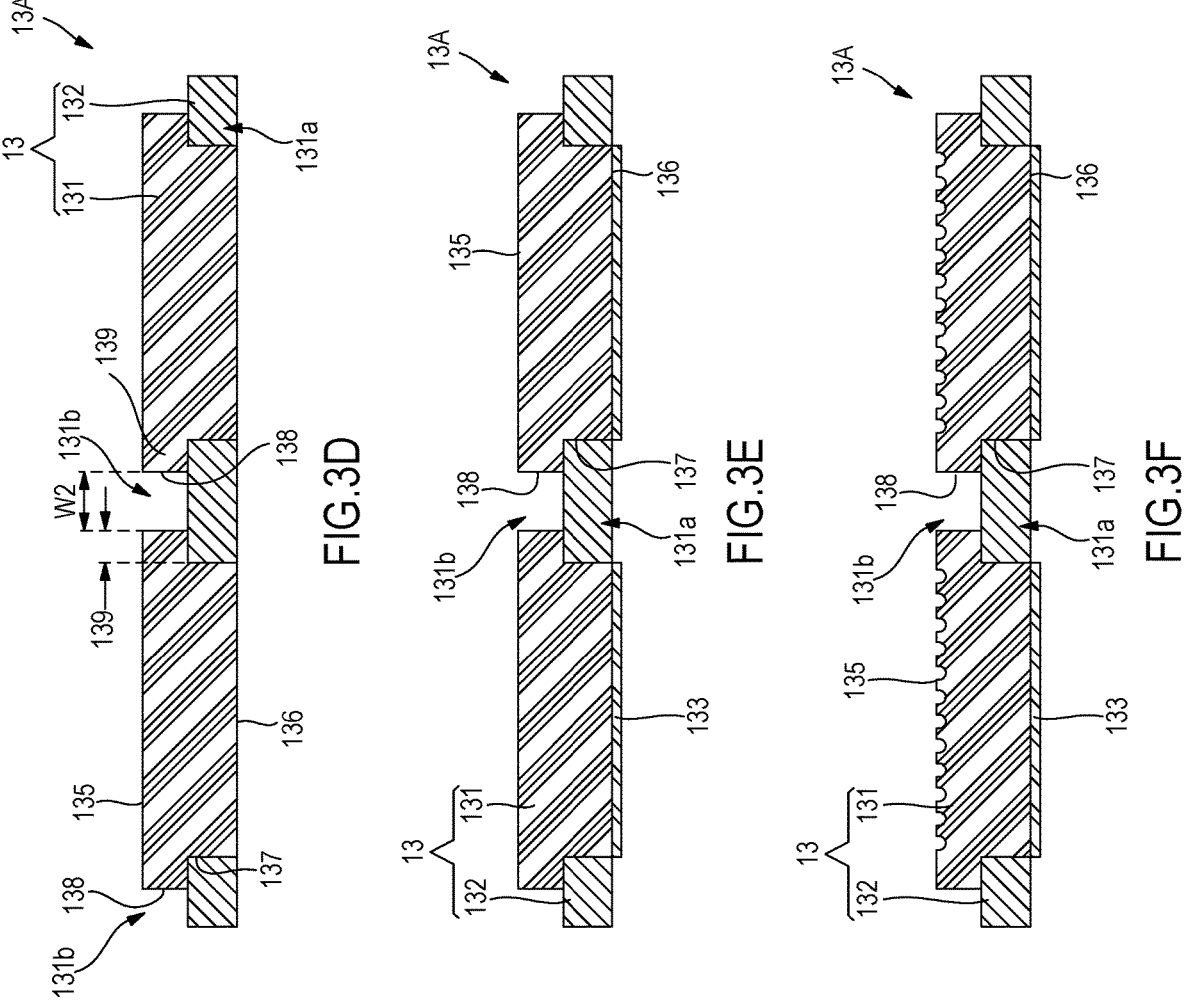

FIG. 3D shows a cross section view of molded heat spreader strip 13A at a later stage of manufacture. In the example shown in FIG. 3D, cavity 131b is defined in first side 135. In accordance with various examples, cavity 131b can be provided by removing a portion of heat spreader substrate 131s from first side 135. Cavity 131b can be defined by sidewall (or lateral side) 138 of heat spreaders 131 and an upper side of mold compound 132 between adjacent heat spreaders 131. In some examples, the width W2 of cavity 131b can be smaller than width W1 (FIG. 3B) of mold compound 132 in cavity 131a. Mold compound 132 can be exposed from heat spreader 131 through cavity 131b. In some examples, the width W2 of cavity 131b can range from approximately 100 μm to approximately 125 μm. In some examples, the depth of cavity 131b can be approximately half the thickness of heat spreader 131 and can range from approximately 50 μm to approximately 127 μm. In some examples, the inner area (or "footprint") of first side 135 can be determined according to the sizes of electronic component 11 and substrate 12. For example, the area of first side 135 can be equal to or greater than the area (or footprint) of first side 112 of electronic component 11 and equal to or smaller than the area of inner side 123 of substrate 12, with momentary reference to FIG. 2D. In some examples, the area of first side 135 of heat spreader 131 can range from approximately 0.1 mm×0.1 mm to approximately 500 mm×500 mm.

In various examples, techniques for forming cavity 131b can be similar to or the same as techniques for forming cavity 131a.

Figure 4A:
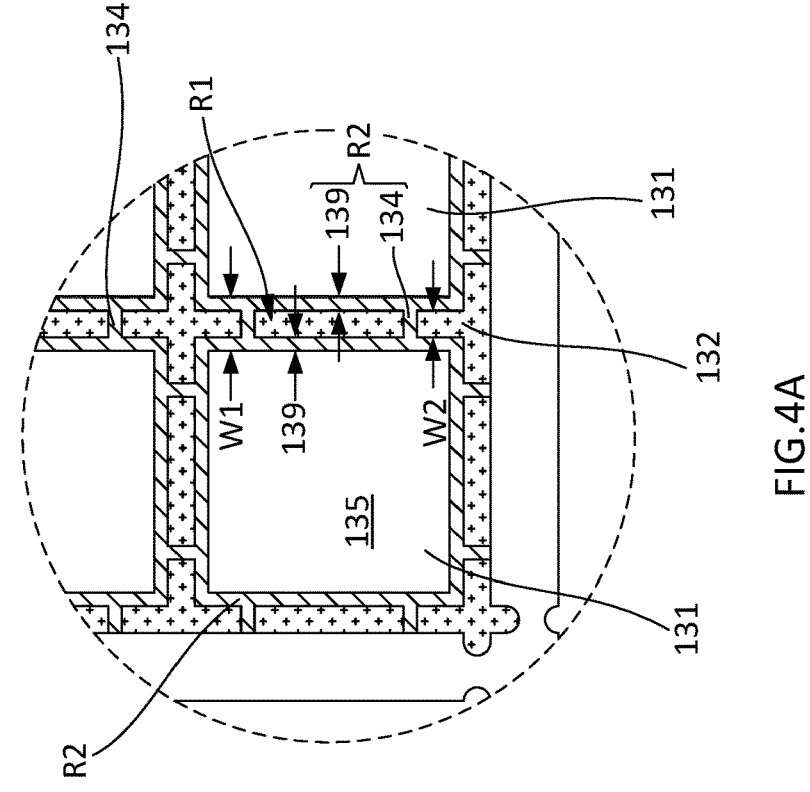
FIGS. 4 and 4A show a plan view of the molded heat spreader strip shown in FIG. 3D.
Figure 4:
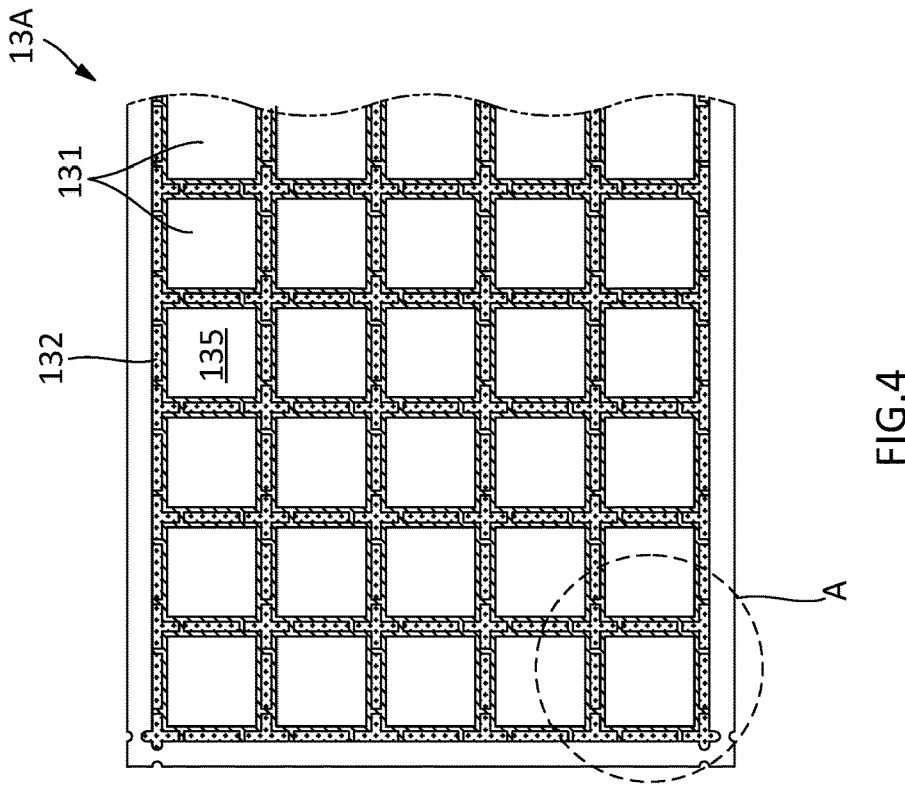

With brief reference to FIGS. 4 and 4A, a plan view of a portion of heat spreader strip 13A is shown, in accordance with various examples. FIG. 4A shows region A of FIG. 4 in greater detail. In the example shown in FIGS. 4 and 4A, region R1 of heat spreader strip 13A includes an area where mold compound 132 is exposed through cavity 131b (of FIG. 3D). Region R2 of heat spreader strip 13A includes an area where heat spreader 131 is located over (e.g., vertically overlaps) mold compound 132. For purposes of clarity only, in FIGS. 4 and 4A, region R2, is shown with a different cross-hashing than the other portions of first side 135 of heat spreader 131. Region R2 can include a shelf or ledge portion 139 of heat spreader 131. Ledge portion 139 of heat spreader 131 can be disposed over (e.g., vertically overlap) mold compound 132 (also depicted in cross-section in FIG. 3D). Returning to FIG. 3D, ledge portion 139 can include side-wall 138 and can define, at least, a portion of cavity 131b. A lower side of ledge portion 139 that is opposite (i.e., oriented away from) first side 135 of heat spreader 131 can define a portion of the floor of cavity 131a.

Returning to FIGS. 4 and 4A, in some examples, heat spreaders 131 can include tie bars 134. Tie bars 134 can connect adjacent heat spreaders 131 to one another. Tie bars 134 can extend between and be connected to the ledge portions 139 of adjacent heat spreaders 131. Tie bars 134 can be formed integrally with head spreaders 131. Tie bars 134 can be located over mold compound 132 and can be included in region R2. In various examples, heat spreaders 131 each include at least one tie bar 134 per lateral side. In some examples, there are at least two tie bars 134 extending from each lateral side (e.g., from sidewall 138) of heat spreader 131. Tie bars 134 can prevent or reduce shifting of heat spreaders during application of mold compound 132. Tie bars 134 can also strengthen molded heat spreader strip 13A to prevent or reduce deformation of molded heat spreader strip 13A, which can occur in the manufacturing process, for example, due to handling or during deposition of device encapsulant 14 (FIG. 2C), as previously described.

FIG. 3E shows molded heat spreader strip 13A at a later stage of manufacture, in accordance with various examples. In the example shown in FIG. 3E, plating layer 133 can be provided on second side 136 of heat spreaders 131. Plating layer 133 can contact and be thermally coupled to second side 136 of heat spreader 131. Plating layer 133 can be provided to prevent or reduce occurrences of surface oxidation or damage to second side 136 of heat spreader 131. Plating layer 133 can facilitate surface mounting. In some examples, plating layer 133 can be provided by plating. Plating layer 133 can comprise tin, nickel, palladium, gold, or silver. The thickness of plating layer 133 can range from approximately 1 μm to approximately 10 μm.

FIG. 3F shows a cross section view of molded heat spreader strip 13A at a later stage of manufacture. In the example shown in FIG. 3F, first side 135 of heat spreader 131 can be subjected to a surface treatment to change characteristics of first side 135. The surface treatment can increase a roughness of the mating surface of first side 135 of heat spreader 131. In some examples, the surface treatment can include providing a photoresist pattern on first side 135 of heat spreader 131, removing portions of heat spreader 131 by etching the portions of first side 135 that are exposed from the photoresist, thereby making the surface of first side 135 uneven, rough, or non-planar. For example, after surface treatment first side 135 can include a plurality of dimples or grooves. In some examples, the surface treatment can include plating a material on first side 135 such that the plated material creates an uneven surface on first side 135. It will be appreciated that the uneven or roughened surface of first side 135 can have a fine pattern invisible to the naked eye. Roughening first side 135 tends to increase bonding strength between heat spreader 131 and device encapsulant 14 (FIG. 1), thereby reducing or preventing separation of device encapsulant from heat spreader 131. While FIGS. 3E and 3F depict providing plating layer 133 prior to surface treating first side 135, it is contemplated and understood that in various examples, plating layer 133 can be provided on second side 136 after surface treating first side 135.

In various examples, molded heat spreader strip 13A can comprise heat spreader 131 and mold compound 132 in the form of a strip. In some examples, molded heat spreader strip 13A can comprise plating layer 133. Molded heat spreader strip 13A can be flipped so the second side 136 having plating layer 133 can be in contact with and be seated on bottom mold chase 1 (FIG. 2A). Referring now to FIG. 2A, bottom mold chase 1 can comprise a flat bottom surface and a sidewall extending upward from an edge of the bottom surface. Bottom mold chase 1 can include cavity 1a that is defined by the bottom surface and the sidewall of bottom mold chase 1. In some examples, molded heat spreader strip 13A can be picked up by pick-and-place equipment and seated in cavity 1a of bottom mold chase 1. The sidewall of molded heat spreader strip 13A can be in contact with or near to the inner side of the sidewall of bottom mold chase 1 defining cavity 1a.

Figures 5, 5A:
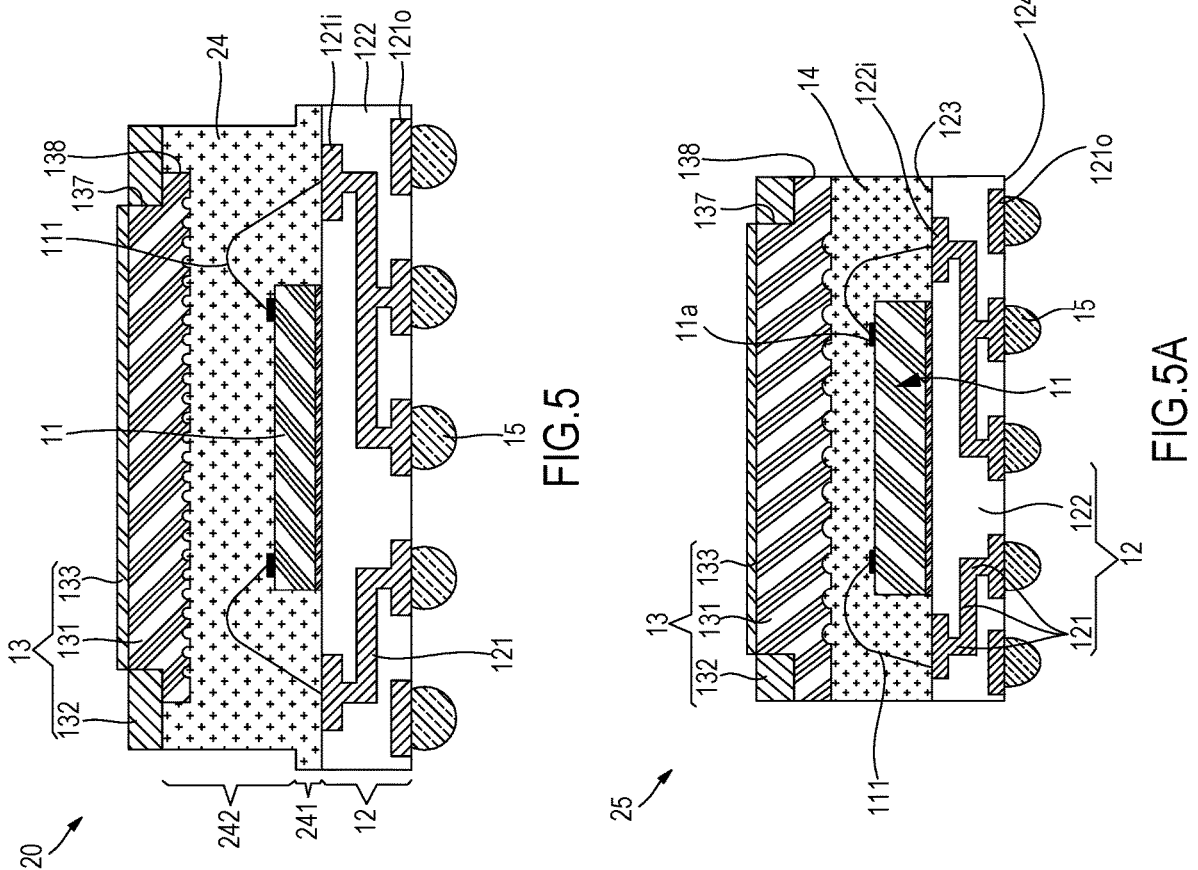
FIG. 5 shows a cross-sectional view of an example electronic device.
FIG. 5A shows a cross-sectional view of an example electronic device.

FIG. 5 shows a cross-sectional view of an example electronic device 20, in accordance with various examples. In the example shown in FIG. 5, electronic device 20 can comprise electronic component 11, substrate 12, molded heat spreader 13, device encapsulant 24, and external interconnects 15.

In accordance with various examples, electronic device 20 can be similar to electronic device 10. For example, electronic device 20 can be similar to, or the same as, electronic device 10 in terms of electronic component 11, substrate 12, heat spreader 13, and external interconnects 15. In electronic device 20, a lower portion 241 of device encapsulant 24 can have a width that is larger than the width of an upper portion 242 of device encapsulant 24. The upper portion 242 of device encapsulant 24 can surround or contact lateral side 138 of heat spreader 131. The greater width of lower portion 241 can create a step on the sidewall of device encapsulant 24. The width of lower portion 241 can be equal to the width of substrate 12. In various examples, a lateral side of mold compound 132 can be coplanar with a lateral side of the upper portion 242 of device encapsulant 24.

In some examples, the step along the sidewall of device encapsulant 24 can be formed during singulation. For example, during a first sawing or dicing process, electronic device 20 can be sawed by cutting through mold compound 132 and partially through device encapsulant 24 in a downward direction. In a second sawing or dicing process, the remaining portion of device encapsulant 24 and substrate 12 can be cut through in the downward direction. The width of the cut or groove (i.e., the sawed area) resulting from the first sawing process can be greater than the width of the cut or groove (i.e., the sawed area) resulting from the second sawing process.

FIG. 5A shows a cross-sectional view of an example electronic device 25, in accordance with various examples. In the example shown in FIG. 5A, electronic device 25 can comprise electronic component 11, substrate 12, molded heat spreader 13, device encapsulant 14, and external interconnects 15.

In accordance with various examples, electronic device 25 can be similar to electronic device 10. For example, electronic device 20 can be similar to, or the same as, electronic device 10 in terms of electronic component 11, substrate 12, heat spreader 13, and external interconnects 15. In electronic device 25, tie bars 134 (FIG. 4A) can be removed from heat spreader 131 during singulation, and the sidewall of device encapsulant 14 can be coplanar with sidewall 138 of heat spreader 131.

Figure 6:
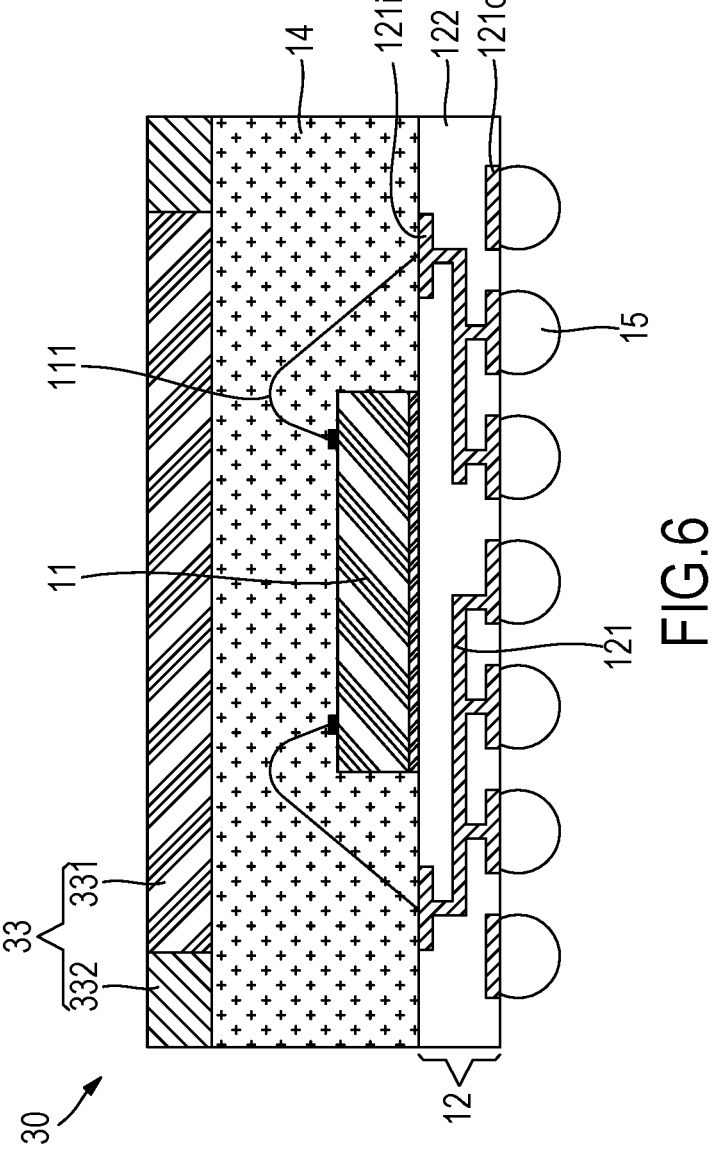
FIG. 6 shows a cross-sectional view of an example electronic device.

FIG. 6 shows a cross-sectional view of an example electronic device 30. In the example shown in FIG. 6, electronic device 30 can comprise electronic component 11, substrate 12, molded heat spreader 33, device encapsulant 14, and external interconnects 15. Electronic device 30 can be similar to electronic device 10. For example, electronic device 30 can be similar to or the same as electronic device 10 in terms of electronic component 11, substrate 12, device encapsulant 14, and external interconnects 15. Electronic device 30 can comprise molded heat spreader 33. Molded heat spreader 33 can comprise heat spreader 331 and mold compound 332. Heat spreader 331 and mold compound 332 can have a similar or same thickness (e.g., a thickness of heat spreader 331 can be approximately equal to a thickness of mold compound 332). As used herein to describe the relative thickness of two components, the term "approximately equal" can mean that the thicknesses are the same, or that the thickness of the thinner component is within 1%, within 2%, within 3%, within 4%, or within 5% of the thickness of the thicker component. The lower sides of mold compound 332 and heat spreader 331 can be coplanar, and the upper sides of mold compound 332 and heat spreader 331 can be coplanar.

Figure 7A:
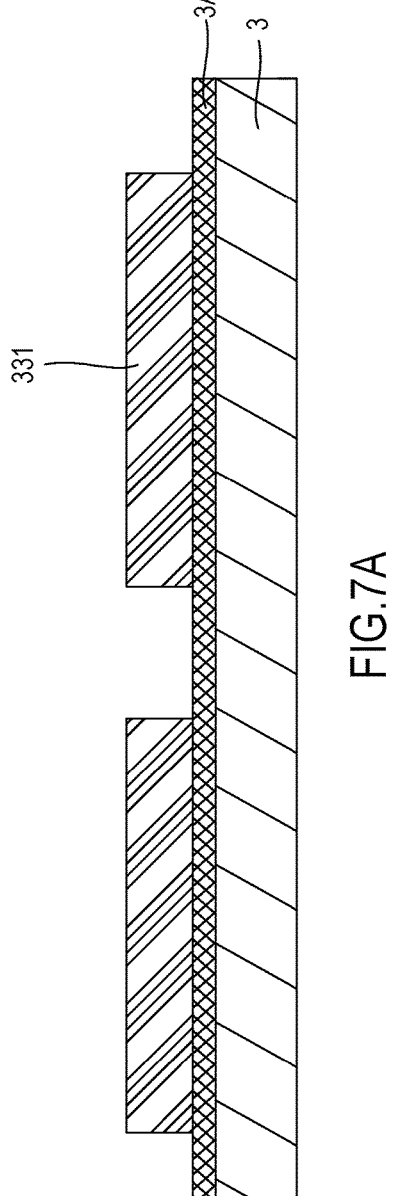
FIGS. 7A to 7F show an example method for manufacturing an electronic device.

FIGS. 7A to 7E show an example method for manufacturing electronic device 30. FIG. 7A shows a cross section view of electronic device 30 at an early stage of manufacture. In the example shown in FIG. 7A, heat spreaders 331 can be provided on the upper side of carrier 3. In various examples, carrier 3 can be a substantially planar plate. In some examples, carrier 3 can comprise or be referred to as a plate, a board, a wafer, a panel, or a strip. Carrier 3 can be made of, for example, steel, stainless steel, aluminum, copper, ceramic, glass, or wafer material (e.g., Si). In some examples, the thickness of carrier 3 can range from approximately 300 μm to approximately 2000 μm, and the width of carrier 3 can range from approximately 100 mm to approximately 1000 mm. Carrier 3 can serve to enable and support the handling of multiple components during a process of providing heat spreader 331.

In some examples, carrier 3 can comprise a temporary bond layer 3A provided on the upper side of carrier 3, and heat spreaders 331 can be provided on the upper side of temporary bond layer 3A. Temporary bond layer 3A can comprise or can be referred to as a temporary adhesive film, temporary adhesive tape or temporary adhesive coating. For example, temporary bond layer 3A can be a thermal release tape (film) or an optical release tape (film), wherein the adhesive strength is weakened or removed by heat or light, respectively. In some examples, the adhesive strength of temporary bond layer 3A can be weakened or removed by physical and/or chemical force. Temporary bond layer 3A can be separated from carrier 3, thereby separating molded heat spreaders 33 from carrier 3, prior to disposing molded heat spreader 33 in bottom mold chase 1, as described in further detail below.

In various examples, heat spreaders 331 can be coupled to the upper side of carrier 3. In some examples, heat spreaders 331 are discrete from one another can be spaced apart in a row, column, grid, or array over carrier 3. For example, heat spreaders 331 can be picked up by pick-and-place equipment and coupled to the upper side of carrier 3 through the temporary bond layer. In some examples, adjacent heat spreaders 331 can be coupled together via tie bars, similar to heat spreaders 131 in FIGS. 4 and 4A, and can be coupled to carrier 3 as a single integral component.

Figure 7B:
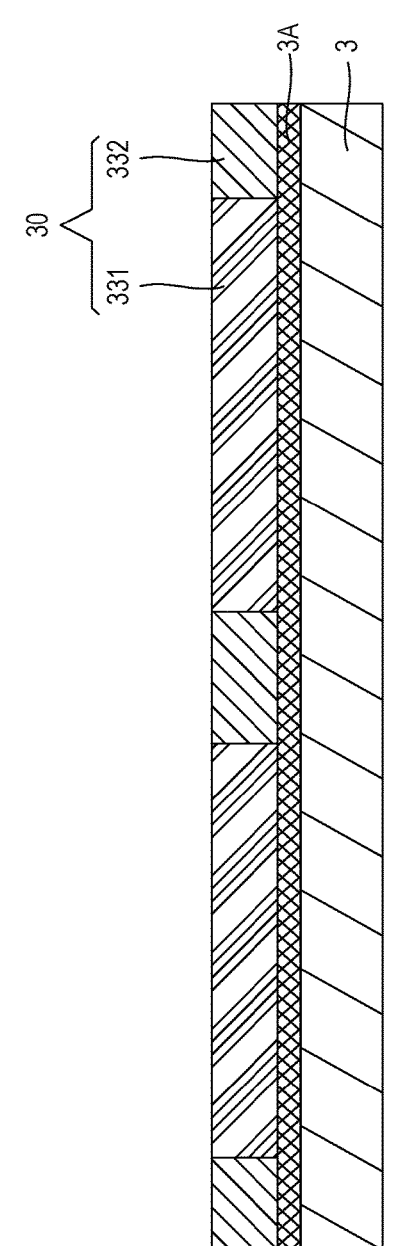

FIG. 7B shows a cross section view of electronic device 30 at a later stage of manufacture. In the example shown in FIG. 7B, mold compound 332 can be provided over the upper side of carrier 3 and around heat spreaders 331. In some examples, mold compound 332 can be provided over the upper side of heat spreaders 331. Any portion of mold compound 332 over heat spreader 331 can then be removed by grinding (in some examples, a portion of the upper side of heat spreaders 331 can also be removed during grinding). The upper side of heat spreader 331 and the upper side of mold compound 332 can be coplanar. In accordance with various examples, elements, features, materials, or manufacturing methods of mold compound 332 can be similar to or the same as those of mold compound 132. The height of mold compound 332 and the height of heat spreader 331 can be approximately equal. In some examples, the height of mold compound 332 and the height of heat spreader 331 can range from approximately 10 μm to approximately 1000 μm.

Figures 7C, 7D:
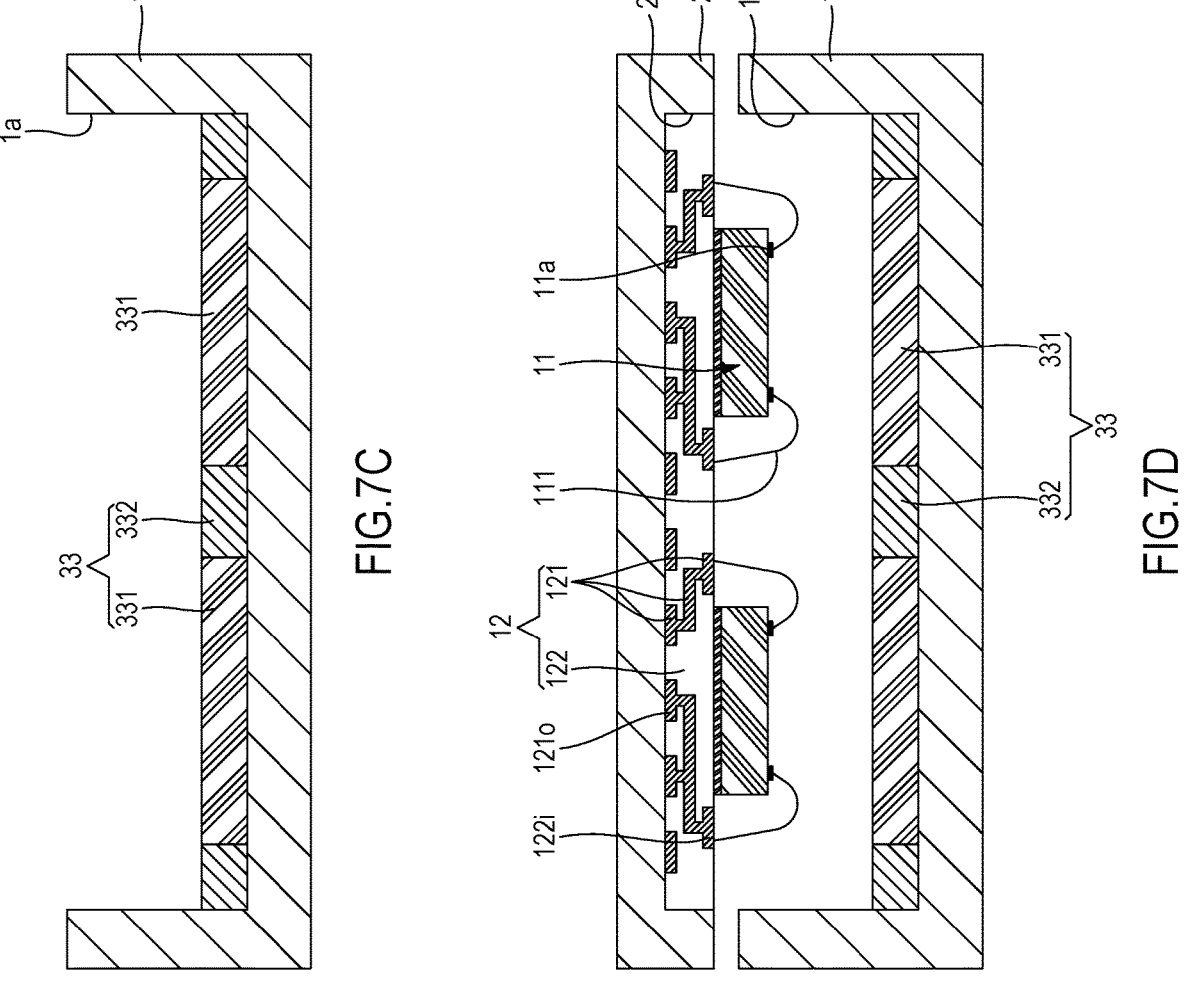

FIG. 7C shows a cross section view of electronic device 30 at a later stage of manufacture. In the example shown in FIG. 7C, molded heat spreader 33 can be seated in bottom mold chase 1. After being separated from carrier 3, molded heat spreader 33 can be seated in cavity 1*a* of bottom mold chase 1. In some examples, the side of heat spreaders 331 that is oriented toward the floor of bottom mold chase 1 can include a plating layer, similar to plating layer 133 of electronic device 10. In some examples, the side of heat spreaders 331 that is oriented away from the floor of bottom mold chase 1 can be roughened (e.g., can be subjected to surface treatment), similar to first side 135 of heat spreader 131 in semiconductor device 10.

FIG. 7D shows a cross section view of electronic device 30 at a later stage of manufacture, in accordance with various examples. In the example of FIG. 7D, top mold chase 2 can retain substrate 12 and electronic component 11 seated in cavity 2*a*. Top mold chase 2 containing substrate 12 and electronic components 11 can be aligned over bottom mold chase 1, such that first side 112 of electronic component 11 is vertically aligned with heat spreader 331. The area (or footprint) of heat spreader 331 can be selected based on the sizes of electronic component 11 and substrate 12. For example, the area (or footprint) of heat spreader 331 can be larger than or equal to the area (or footprint) of electronic component 11 and smaller than the area (or footprint) of substrate 12. In some examples, the area of heat spreader 331 can range from approximately 0.1 mm×0.1 mm to approximately 500 mm×500 mm.

The alignment of top mold chase 2 over bottom mold chase 1 can be similar to or the same as the alignment of bottom mold chase 1 and top mold chase 2 of electronic device 10. Top mold chase 2, substrate 12, and electronic component 11 of electronic device 30 can have elements, features, materials, or manufacturing methods that are similar to or the same as those of top mold chase 2, substrate 12, and electronic component 11 of electronic device 10.

Figures 7E, 7F:
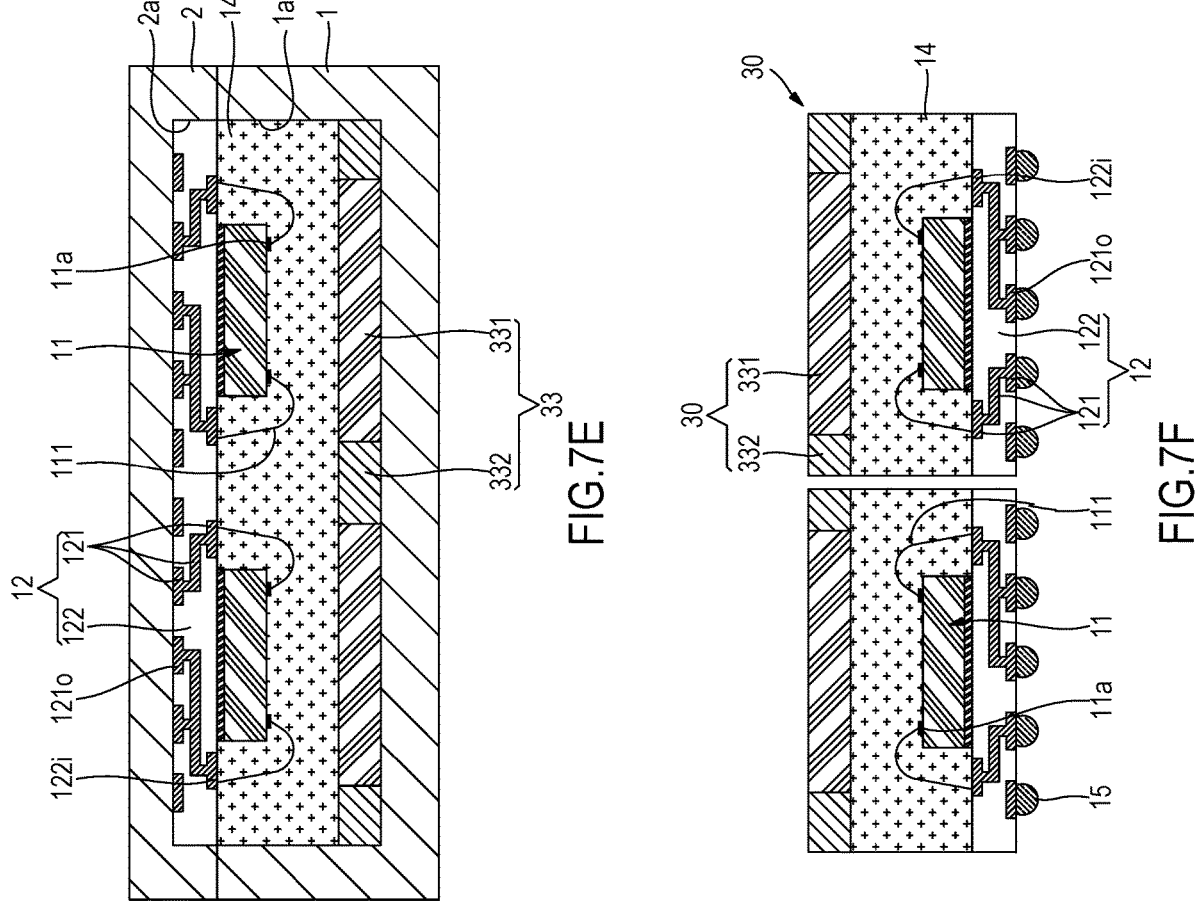

FIG. 7E shows a cross section view of electronic device 30 at a later stage of manufacture, in accordance with various examples. In the example shown in FIG. 7E, device encapsulant 14 can be provided between substrate 12 and molded heat spreader 33 and between electronic component 11 and molded heat spreader 33. Device encapsulant 14 can be provided to fill open space in cavity 1*a* of bottom mold chase 1 and in cavity 2*a* of top mold chase 2. In accordance with various examples, elements, features, materials, or manufacturing methods of device encapsulant 14 can be similar to or the same as those of device encapsulant 14 of electronic device 10.

FIG. 7F shows a cross section view of electronic device 30 at a later stage of manufacture, in accordance with various examples. In the example shown in FIG. 7F, external interconnects 15 can be provided on substrate outer terminals 121*o* of substrate 12. External interconnects 15 can have elements, features, materials, or manufacturing methods that are similar to or the same as those of external interconnects 15 of electronic device 10.

After external interconnects 15 are provided, substrate 12, mold compound 332 of molded heat spreader 33, and device encapsulant 14 can be sawed to separate strip-type electronic devices 30 into individual electronic devices 30. For example, substrate 12, mold compound 332, and device encapsulant 14 can be separated into individual electronic devices 30 by singulating using a diamond wheel, a laser beam, or an etching process. In some examples, a two-step singulation, as described above with respect to electronic device 20 in FIG. 5, can be performed, and device encapsulant can include a stepped lateral side, similar to or the same as device encapsulant 24 of electronic device 20.

Figures 8, 9A:
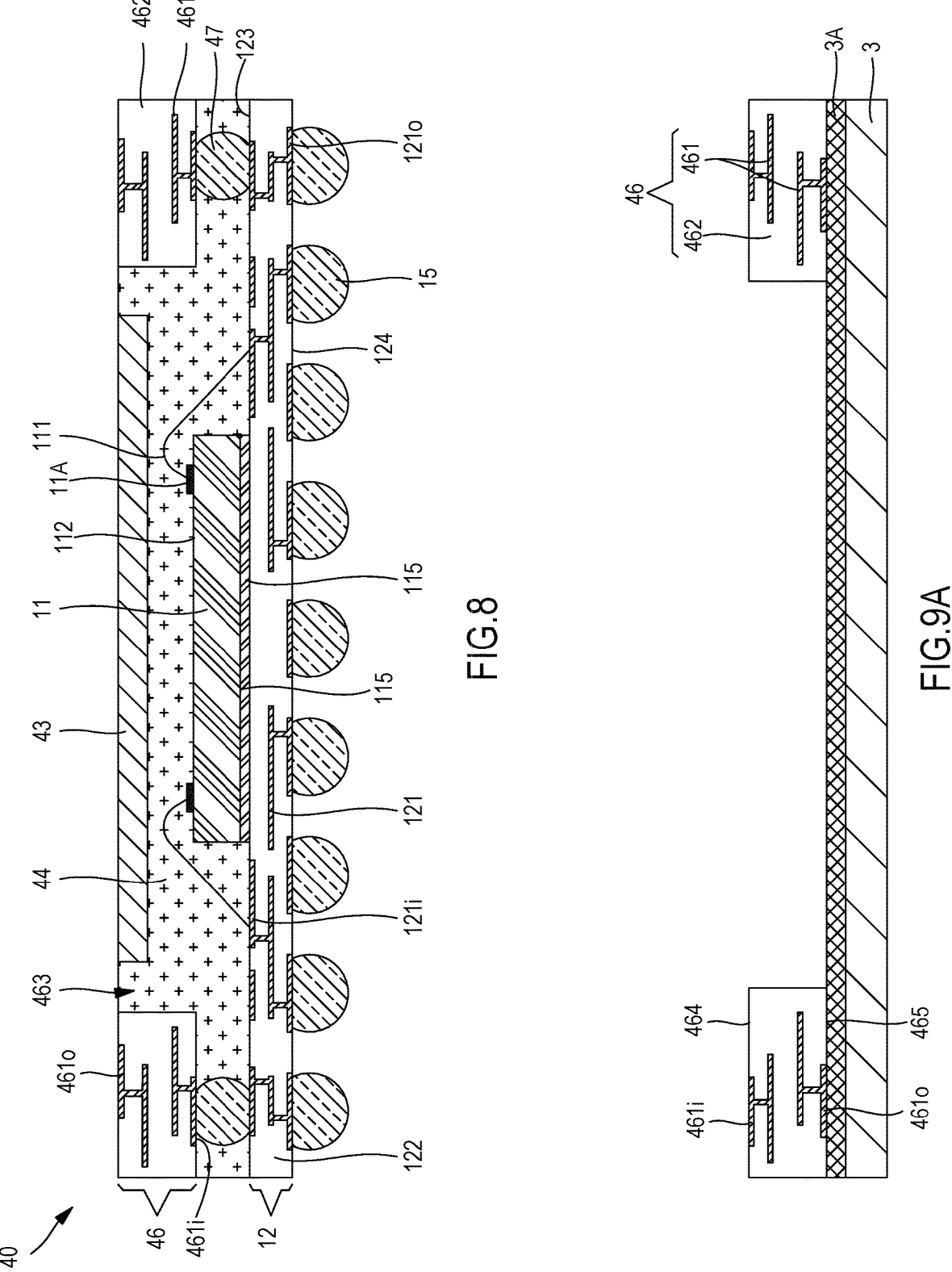
FIG. 8 shows a cross-sectional view of an example electronic device.
FIGS. 9A to 9E show an example method for manufacturing an electronic device.

FIG. 8 shows a cross-sectional view of an example electronic device 40, in accordance with various examples. In the example shown in FIG. 8, electronic device 40 can comprise electronic component 11, substrate 12, heat spreader 43, device encapsulant 44, external interconnects 15, cavity interposer 46, and internal interconnects 47.

Electronic device 40 can be similar to electronic device 10. For example, electronic device 40 can be similar to or the same as electronic device 10 in terms of electronic component 11, substrate 12, and external interconnects 15. Electronic device 40 can comprise heat spreader 43, device encapsulant 44, cavity interposer 46, and internal interconnects 47. Cavity interposer 46 can comprise interposer conductive structure 461 and interposer dielectric structure 462. Cavity interposer 46 can comprise cavity 463. Interposer conductive structure 461 can include inner terminals 461*i* and outer terminals 461*o*. Internal interconnects 47 can be coupled to inner terminals 461*i* of cavity interposer 46 and inner terminals 121*i* of substrate 12.

FIGS. 9A to 9F show cross-sectional views of an example method for manufacturing an example electronic device 40. FIG. 9A shows a cross section view of electronic device 40 at an early stage of manufacture, in accordance with various examples. In the example shown in FIG. 9A, cavity interposer 46 can be provided on the upper side of carrier 3. In some examples, carrier 3 can include temporary bond layer 3A, as previously described.

In various examples, cavity interposer 46 can include and define a cavity 463 extending through cavity interposer 46. For example, cavity 463 can extend from a first (or inner) side 464 of cavity interposer 46 to a second (or outer) side 465 of cavity interposer 46. In some examples, cavity 463 can comprise or be referred to as an opening or an orifice. Cavity interposer 46 can comprise interposer conductive structure 461 and interposer dielectric structure 462. Interposer conductive structure 461 can comprise inner terminals 461*i* located at inner side 464 of cavity interposer 46 and outer terminals 461*o* located at outer side 465 of cavity interposer 46. In accordance with various embodiments, elements, features, materials, or manufacturing methods of interposer conductive structure 461 can be similar to, or the same as, those of conductive structure 121 of substrate 12, as previously described. Similarly, elements, features, materials, or manufacturing methods of interposer dielectric structure 462 can be similar to, or the same as, those of dielectric structure 122 of substrate 12, as previously described. In some examples, cavity interposer 46 can be formed (e.g., built-up) on carrier 3. In other examples, cavity interposer 46 can be formed apart from carrier 3 and can be located on carrier 3 using, for example, pick-and-place equipment. In some examples, cavity interposer 46 can have a thickness of approximately 0.2 mm to 4 mm.

Figure 9B:
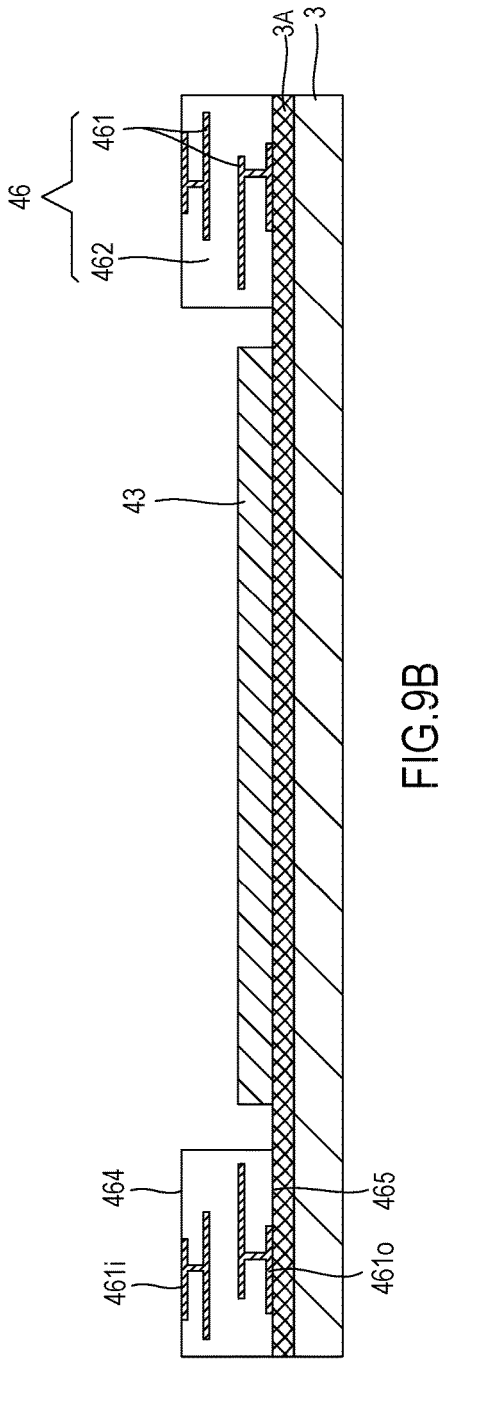

FIG. 9B shows a cross section view of electronic device 40 at a later stage of manufacture, in accordance with various embodiments. In the example shown in FIG. 9B, heat spreader 43 can be provided in cavity 463 of cavity interposer 46. Heat spreader 43 can be substantially a planar plate. The outer side of heat spreader 43 can be coupled to carrier 3 through temporary bond layer 3A. The area (or footprint) of heat spreader 43 can be smaller than the area of cavity 463. A sidewall of heat spreader 43 can be spaced apart from the sidewall of cavity interposer 46 that defines cavity 463. Sidewalls can also be referred to herein as lateral sides. In various examples, elements, features, materials, or manufacturing methods of heat spreader 43 can be similar to or the same as those of heat spreader 331.

Figure 9C:
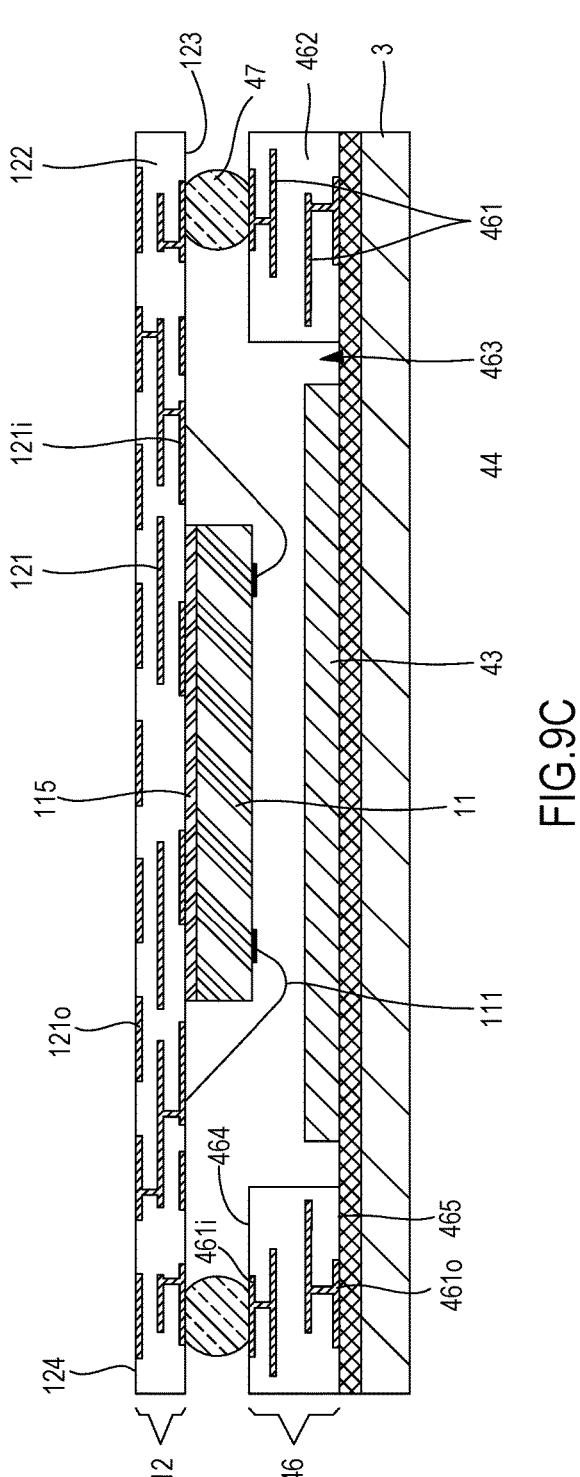

FIG. 9C shows a cross section view of electronic device 40 at a later stage of manufacture, in accordance with various examples. In the example shown in FIG. 9C, substrate 12, having electronic component 11 coupled to inner side 123, can be provided over cavity interposer 46 and heat spreader 43. In various examples, substrate 12 and electronic component 11 can have elements, features, materials, or manufacturing methods similar to or the same as those of substrate 12 and electronic component 11, respectively, of electronic device 10.

Internal interconnects 47 can be coupled to inner terminals 121*i* of substrate 12. Internal interconnects 47 can be aligned with and coupled to inner terminals 461*i* of cavity interposer 46. Internal interconnects 47 can couple conductive structure 121 of substrate 12 to interposer conductive structure 461 of cavity interposer 46. Internal interconnects 47 can be spaced apart from the sidewalls of electronic component 11. In accordance with various examples, internal interconnects 47 can comprise posts, pillars, vertical wires, bumps, or solder-coated-metallic-core-balls. In some examples, internal interconnects 47 can be provided by ball drop, electroplating, electroless plating, sputtering, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some example, internal interconnects 47 can be made of solder, copper, gold, silver, palladium, or nickel. In some examples, the thickness (or height) of internal interconnects 47 can be approximately 0.3 mm to approximately 3 mm.

In accordance with various examples, electronic component 11 can be located over the upper (or inner) side of heat spreader 43. For example, electronic component 11 can vertically overlap heat spreader 43. In some examples, the area of heat spreader 43 can be determined according to the sizes of electronic component 11 and substrate 12. For example, the area of the heat spreader 331 can be larger than or equal to the area of electronic component 11 and smaller than the area of substrate 12. In some examples, the area of heat spreader 43 can range from approximately 0.1 mm×0.1 mm to approximately 500 mm×500 mm. In some examples, the side of heat spreader 43 that is oriented away from electronic component 11 can include a plating layer, similar to plating layer 133 of electronic device 10. In some examples, the side of heat spreaders 43 that is oriented toward electronic component 11 can be roughened (e.g., can be subjected to surface treatment), similar to first side 135 of heat spreader 131 in semiconductor device 10.

Figures 9D, 9E:
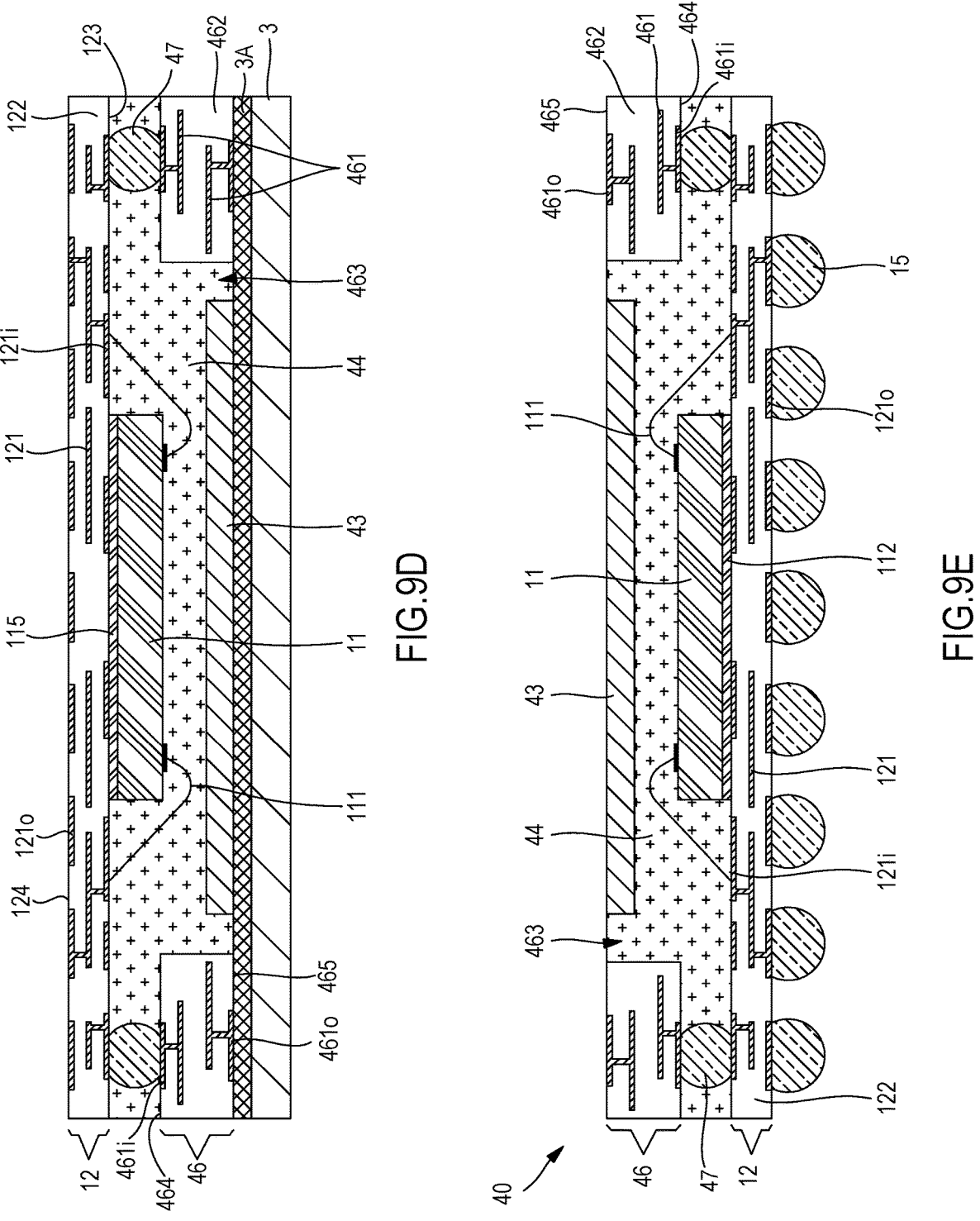

FIG. 9D shows a cross section view of electronic device 40 at a later stage of manufacture, in accordance with various examples. In the example shown in FIG. 9D, device encapsulant 44 can be provided between substrate 12 and carrier 3. Device encapsulant 44 can be in contact with inner side 123 of substrate 12, sidewalls of internal interconnects 47, inner side 464 of cavity interposer 46, the sidewalls of cavity interposer 46 that define cavity 463, the inner side and sidewalls of heat spreader 43, and the upper side of carrier 3 (or temporary bond layer 3A). In some examples, elements, features, materials, or manufacturing methods of device encapsulant 44 can be similar to or the same as those of device encapsulant 14 of electronic device 10. For example, device encapsulant 44 can be provided by transfer molding.

FIG. 9E shows a cross section view of electronic device 40 at a later stage of manufacture, in accordance with various examples. In the example shown in FIG. 9E, external interconnects 15 can be provided on outer terminals 121*o* of substrate 12. External interconnects 15 can have elements, features, materials, or manufacturing methods similar to or the same as those of external interconnects 15 of electronic device 10.

Before external interconnects 15 are provided, carrier 3 can be removed from heat spreader 43 and cavity interposer 46. In some examples, after carrier 3 is removed, a plating layer can be provided to the outer side of heat spreader 43. After external interconnects 15 are provided, a singulation process can be performed. For example, during singulation, device encapsulant 44, substrate 12, or cavity interposer 46 can be sawed to provide individual electronic devices 40.

Figure 10:
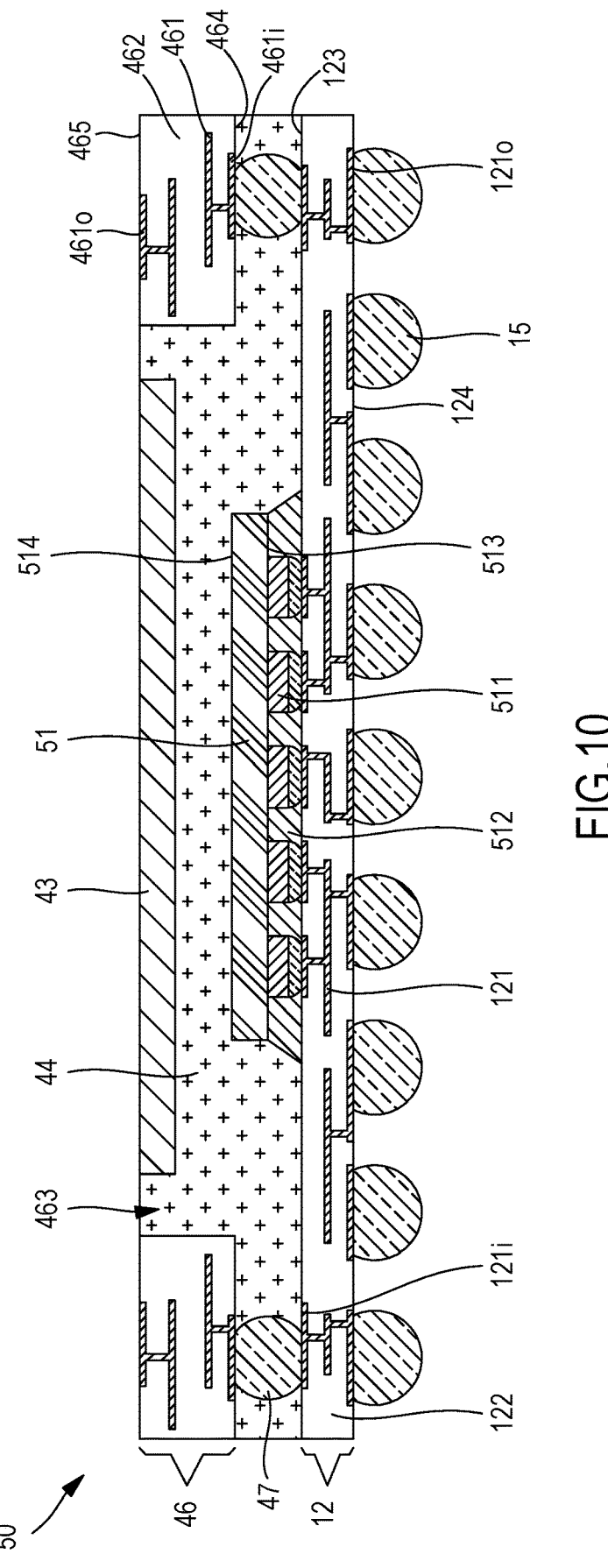
FIG. 10 shows a cross-sectional view of an example electronic device.

FIG. 10 shows a cross-sectional view of an example electronic device 50, in accordance with various examples. In the example shown in FIG. 10, electronic device 50 can comprise electronic component 51, substrate 12, heat spreader 43, device encapsulant 44, external interconnects 15, cavity interposer 46, and internal interconnects 47.

In various examples, electronic device 50 can be similar to electronic device 40. For example, electronic device 50 can be similar to or the same as electronic device 40 in terms of substrate 12, heat spreader 43, device encapsulant 44, external interconnects 15, cavity interposer 46, and internal interconnects 47. Electronic device 50 can comprise electronic component 51.

In various examples, electronic component 51 can comprise component interconnects 511 and underfill 512. Side 513 of electronic component 51 can comprise or be referred to as an active side, and the opposite side 514 of electronic component 51 can comprise or be referred to as an inactive side. Electronic component 51 can comprise contact pads spaced apart from each other in a row or column direction over side 513. Component interconnects 511 can be coupled to the contact pads of electronic component 51. In some examples, component interconnects 511 can comprise or be referred to as bumps, SnPb bumps, leadfree bumps, CuP, stud bumps, pillars, or posts. In some examples, component interconnects 511 can be provided on the contact pads of electronic component 51 by electroplating, electroless plating, sputtering, deposition such as PVD, CVD, MOCVD, ALD, LPCVD, or PECVD.

In some examples, electronic component 51 can be positioned on inner side 123 of substrate 12 using pick-and-place equipment. Component interconnects 511 of electronic component 51 can be positioned over inner terminals 121*i* of substrate 12. Subsequently, component interconnects 511 of electronic component 51 can be coupled to inner terminals 121*i* of substrate 12 through a reflow process or a thermal compression bonding process. Electronic component 51 can be electrically coupled to conductive structure 121 of substrate 12 through component interconnects 511. In some examples, the overall thickness of electronic component 51 can range from approximately 0.3 mm to approximately 9 mm, and the area of electronic component 51 can range from approximately 0.5 mm×0.5 mm to approximately 70 mm×70 mm.

In various examples, underfill 512 can be provided between electronic component 51 and substrate 12. Underfill 512 can be in contact with side 513 of electronic component 51 and inner side 123 of substrate 12. In some examples, underfill 512 can be in contact with component interconnects 511 of electronic component 51. Underfill 512 can comprise or be referred to as a dielectric layer or a non-conductive paste, and can be free of inorganic fillers. In some examples, underfill 512 can comprise or be referred to as capillary underfill (CUF), nonconductive paste (NCP), nonconductive film (NCF), anisotropic conductive film (ACF), or anisotropic conductive paste (ACP). In some examples, device encapsulant 44 can comprise molded underfill (MUF), such that underfill 512 can be considered part of device encapsulant 44 (e.g., device encapsulant 44 can be located between side 513 of electronic component 51, inner side 123 of substrate 12, or can contact side 513 of electronic component 51, inner side 123 of substrate 12 or component interconnects 511). In some examples, underfill 512 can be cured after being interposed between electronic component 51 and substrate 12. Underfill 512 can prevent electronic component 51 from being separated from substrate 12 due to physical and chemical impacts.

Molded heat spreader strips can be made and used as described above. The molded heat spreaders can be in strip form comprising a row, column, grid, or array of heat spreaders coupled to one another. Mold compound can couple adjacent heat spreaders to one another. Tie bars can couple adjacent heat spreaders to one another. The mold compound and tie bars can define singulation lines. The mold compound and tie bars coupling adjacent heat spreaders tend to maintain a flatness of the molded heat spreader strips during processing steps. Cutting along the singulation lines tends to reduce burring, flaking, or generation of other artifacts caused by cutting hard materials such as metals.

The present disclosure includes reference to certain examples; however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. An electronic device, comprising:
a substrate;
an electronic component disposed over the substrate;
an encapsulant disposed over the substrate and the electronic component;
a molded heat spreader disposed over the encapsulant, wherein the molded heat spreader comprises:
a heat spreader; and
a mold compound disposed around a lateral side of the heat spreader, wherein a lateral side of the mold compound is coplanar with a lateral side of the encapsulant.

2. The electronic device of claim 1, wherein the heat spreader comprises a first side subjected to a surface treatment to increase a roughness, wherein the first side is oriented towards the encapsulant.

3. The electronic device of claim 2, further comprising a plating layer disposed over a second side of the heat spreader opposite the first side.

4. The electronic device of claim 1, further comprising:
a bond pad of the electronic component oriented away from the substrate; and
a component interconnect coupling the bond pad to the substrate.

5. The electronic device of claim 1, wherein the mold compound is disposed over a portion of the heat spreader, around the lateral side of the heat spreader, and over the encapsulant.

6. The electronic device of claim 1, wherein a lower side of the heat spreader extends below a lower side of the mold compound.

7. The electronic device of claim 1, wherein the substrate comprises a redistribution layer (RDL) substrate.

8. The electronic device of claim 1, wherein the lateral side of the encapsulant comprises a step, wherein a first portion of the lateral side of the encapsulant is coplanar with the lateral side of the mold compound, wherein a second portion of the lateral side of the encapsulant protrudes from the first portion.

9. The electronic device of claim 1, wherein the lateral side of the heat spreader comprises a step.

10. An electronic device, comprising:
a substrate;
an electronic component disposed over the substrate;
an interposer disposed over the substrate and defining a cavity;
a heat spreader disposed over the electronic component and in the cavity defined by the interposer; and
an encapsulant disposed between the heat spreader and the electronic component and disposed between the heat spreader and the interposer.

11. The electronic device of claim 10, further comprising:
a bond pad of the electronic component oriented away from the substrate; and
a component interconnect coupling the bond pad to the substrate.

12. The electronic device of claim 10, wherein the substrate comprises a redistribution layer (RDL) substrate.

13. The electronic device of claim 10, further comprising an internal interconnect coupling the substrate to the interposer.

14. The electronic device of claim 10, further comprising a component interconnect disposed between the electronic component and the substrate, wherein the component interconnect couples the electronic component to the substrate.

* * * * *